(12) United States Patent
Najafi et al.

(10) Patent No.: US 12,249,641 B1
(45) Date of Patent: Mar. 11, 2025

(54) PHOTON NUMBER RESOLVING DETECTOR WITH THERMAL DIODE

(71) Applicant: PsiQuantum Corp, Palo Alto, CA (US)

(72) Inventors: Faraz Najafi, Palo Alto, CA (US); Qiaodan Jin Stone, Sunnyvale, CA (US); Andrea Bahgat Shehata, Mountain View, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 0 days.

(21) Appl. No.: 18/383,009

(22) Filed: Oct. 23, 2023

Related U.S. Application Data

(63) Continuation of application No. 17/705,201, filed on Mar. 25, 2022, now Pat. No. 11,799,020, which is a
(Continued)

(51) Int. Cl.
*H01L 29/66* (2006.01)
*H01L 23/34* (2006.01)
(Continued)

(52) U.S. Cl.
CPC ...... *H01L 29/66992* (2013.01); *H01L 23/345* (2013.01); *H01L 29/861* (2013.01);
(Continued)

(58) Field of Classification Search
CPC ............. H01L 29/66992; H01L 23/345; H01L 29/861; H01L 29/868; H01L 31/09; H01L 31/107; H10N 60/30; H10N 69/00
See application file for complete search history.

(56) References Cited

U.S. PATENT DOCUMENTS 3,059,196 A   10/1962 Lentz
3,119,076 A   1/1964 Schlig et al.
(Continued)

FOREIGN PATENT DOCUMENTS

CN   106289515 A   1/2017
CN   106549099 A   3/2017
(Continued)

OTHER PUBLICATIONS

Akhlaghi et al., "Gated Mode Superconducting Nanowire Single Photon Detectors," Optics Express, vol. 20, No. 2, Jan. 16, 2012, 9 pgs.
(Continued)

*Primary Examiner* — David Vu
*Assistant Examiner* — Brandon C Fox
(74) *Attorney, Agent, or Firm* — Morgan, Lewis & Bockius LLP

(57) ABSTRACT

The various embodiments described herein include methods, devices, and systems for fabricating and operating diodes. In one aspect, an electrical circuit includes: (1) a diode component having a particular energy band gap; (2) an electrical source electrically coupled to the diode component and configured to bias the diode component in a particular state; and (3) a heating component thermally coupled to a junction of the diode component and configured to selectively supply heat corresponding to the particular energy band gap.

20 Claims, 15 Drawing Sheets

Related U.S. Application Data continuation of application No. 16/773,921, filed on Jan. 27, 2020, now Pat. No. 11,289,590.

(60) Provisional application No. 62/798,983, filed on Jan. 30, 2019.

(51) Int. Cl.
| | |
|---|---|
| *H01L 29/861* | (2006.01) |
| *H01L 29/868* | (2006.01) |
| *H01L 31/09* | (2006.01) |
| *H01L 31/107* | (2006.01) |
| *H10N 60/30* | (2023.01) |
| *H10N 69/00* | (2023.01) |

(52) U.S. Cl.
CPC ............ *H01L 29/868* (2013.01); *H01L 31/09* (2013.01); *H01L 31/107* (2013.01); *H10N 60/30* (2023.02); *H10N 69/00* (2023.02)

(56) References Cited

U.S. PATENT DOCUMENTS

| | | | |
|---|---|---|---|
| 3,283,282 A | 11/1966 | Rosenberg | |
| 4,336,561 A | 6/1982 | Murphy | |
| 4,365,317 A | 12/1982 | Gheewala | |
| 4,509,146 A | 4/1985 | Wang et al. | |
| 4,647,954 A | 3/1987 | Graf et al. | |
| 4,989,051 A | 1/1991 | Whitehead et al. | |
| 5,026,682 A | 6/1991 | Clark et al. | |
| 5,030,614 A | 7/1991 | Hollander et al. | |
| 5,030,617 A | 7/1991 | Legge | |
| 5,041,880 A | 8/1991 | Nojima et al. | |
| 5,051,787 A | 9/1991 | Hasegawa | |
| 5,053,383 A | 10/1991 | Short et al. | |
| 5,127,928 A | 7/1992 | Farries et al. | |
| 5,173,620 A | 12/1992 | Fujimaki et al. | |
| 5,219,826 A | 6/1993 | Kapitulnik | |
| 5,247,475 A | 9/1993 | Hasunuma et al. | |
| 5,321,004 A | 6/1994 | Perez et al. | |
| 5,365,476 A | 11/1994 | Mukhanov | |
| 5,376,626 A | 12/1994 | Drehman et al. | |
| 5,455,519 A | 10/1995 | Ohori | |
| 5,481,119 A | 1/1996 | Higashino et al. | |
| 5,521,862 A | 5/1996 | Frazier | |
| 5,574,290 A | 11/1996 | You | |
| 5,719,105 A | 2/1998 | Odagawa et al. | |
| 5,825,240 A | 10/1998 | Geis et al. | |
| 5,831,278 A | 11/1998 | Berkowitz | |
| 5,892,644 A | 4/1999 | Evans et al. | |
| 5,925,892 A | 7/1999 | Mizuno et al. | |
| 6,029,075 A | 2/2000 | Das et al. | |
| 6,078,517 A | 6/2000 | Herr | |
| 6,242,939 B1 | 6/2001 | Nagasawa | |
| 6,433,974 B2 | 8/2002 | Heismann | |
| 6,774,463 B1 | 8/2004 | Chaudhari et al. | |
| 7,227,438 B2 | 6/2007 | Song et al. | |
| 7,513,765 B2 | 4/2009 | Liao | |
| 7,558,030 B2 | 7/2009 | Lee et al. | |
| 7,589,323 B2 | 9/2009 | Tanaka et al. | |
| 7,724,083 B2 | 5/2010 | Herring et al. | |
| 7,847,282 B2 | 12/2010 | Sandhu | |
| 7,852,106 B2 | 12/2010 | Herr et al. | |
| 8,330,145 B2 | 12/2012 | Wakana et al. | |
| 8,565,844 B2 | 10/2013 | Smith | |
| 8,577,430 B1 | 11/2013 | Smith | |
| 8,736,085 B2 | 5/2014 | Sines | |
| 9,293,240 B2 | 3/2016 | Flex-Cable | |
| 9,443,576 B1 | 9/2016 | Miller | |
| 9,500,519 B2 | 11/2016 | Tang et al. | |
| 9,509,315 B2 | 11/2016 | McCaughan et al. | |
| 9,853,645 B1 | 12/2017 | Mukhanov et al. | |
| 9,876,505 B1 | 1/2018 | Dai et al. | |
| 9,954,158 B2 | 4/2018 | You et al. | |
| 9,998,122 B2 | 6/2018 | Hamilton et al. | |
| 10,103,736 B1 | 10/2018 | Powell et al. | |
| 10,133,986 B1 | 11/2018 | Newton et al. | |
| 10,171,086 B2 | 1/2019 | McCaughan et al. | |
| 10,177,298 B1 | 1/2019 | Taylor et al. | |
| 10,186,858 B2 | 1/2019 | Klaus et al. | |
| 10,197,440 B2 | 2/2019 | Najafi | |
| 10,262,776 B2 | 4/2019 | Choi et al. | |
| 10,361,703 B2 | 7/2019 | Najafi | |
| 10,386,229 B2 | 8/2019 | Najafi et al. | |
| 10,396,733 B2 | 8/2019 | Najafi et al. | |
| 10,454,014 B2 | 10/2019 | Najafi et al. | |
| 10,566,516 B2 | 2/2020 | Najafi | |
| 10,573,800 B1 | 2/2020 | Najafi | |
| 10,580,446 B1 * | 3/2020 | Wessel ..................... G11B 5/02 |
| 10,586,910 B2 | 3/2020 | Najafi | |
| 10,620,044 B2 | 4/2020 | Thompson et al. | |
| 10,651,325 B2 | 5/2020 | Najafi et al. | |
| 10,879,905 B2 | 12/2020 | Najafi et al. | |
| 10,897,235 B2 | 1/2021 | Najafi et al. | |
| 10,911,031 B2 | 2/2021 | Wise et al. | |
| 10,944,403 B2 | 3/2021 | Najafi | |
| 11,009,387 B2 | 5/2021 | Chung et al. | |
| 2002/0149453 A1 | 10/2002 | Snitchler et al. | |
| 2003/0087503 A1 | 5/2003 | Sakaguchi et al. | |
| 2005/0153843 A1 | 7/2005 | Kubota | |
| 2005/0197254 A1 | 9/2005 | Stasiak et al. | |
| 2006/0073979 A1 | 4/2006 | Thieme et al. | |
| 2006/0183327 A1 | 8/2006 | Moon | |
| 2006/0270224 A1 | 11/2006 | Song et al. | |
| 2008/0026234 A1 | 1/2008 | Sambasivan et al. | |
| 2009/0014433 A1 | 1/2009 | O'Neil et al. | |
| 2010/0026447 A1 | 2/2010 | Keefe et al. | |
| 2010/0171098 A1 | 7/2010 | Suzuki | |
| 2011/0108803 A1 | 5/2011 | Deligianni et al. | |
| 2011/0116742 A1 | 5/2011 | Chang et al. | |
| 2011/0254053 A1 | 10/2011 | Goupil et al. | |
| 2013/0012392 A1 | 1/2013 | Tanaka et al. | |
| 2013/0090244 A1 | 4/2013 | Shinzato et al. | |
| 2013/0124112 A1 | 5/2013 | Heath et al. | |
| 2013/0143744 A1 | 6/2013 | Marsili et al. | |
| 2013/0341594 A1 | 12/2013 | Mohseni et al. | |
| 2014/0113828 A1 | 4/2014 | Gilbert et al. | |
| 2014/0299751 A1 | 10/2014 | Tang et al. | |
| 2015/0018218 A1 | 1/2015 | Lakrimi et al. | |
| 2015/0076605 A1 | 3/2015 | Cai | |
| 2015/0179916 A1 | 6/2015 | Pramanik et al. | |
| 2015/0348681 A1 | 12/2015 | Huh | |
| 2016/0028402 A1 | 1/2016 | McCaughan et al. | |
| 2016/0028403 A1 | 1/2016 | McCughan et al. | |
| 2016/0356708 A1 | 12/2016 | Bennett et al. | |
| 2017/0186933 A1 | 6/2017 | Sunter et al. | |
| 2018/0033944 A1 | 2/2018 | Ladizinsky et al. | |
| 2018/0145664 A1 | 5/2018 | Herr et al. | |
| 2018/0364097 A1 | 12/2018 | Najafi | |
| 2018/0374979 A1 | 12/2018 | Nozawa | |
| 2019/0027672 A1 | 1/2019 | Megrant | |
| 2019/0035904 A1 | 1/2019 | Najafi | |
| 2019/0035999 A1 | 1/2019 | Najafi | |
| 2019/0044051 A1 | 2/2019 | Caudillo et al. | |
| 2019/0109595 A1 | 4/2019 | Najafi | |
| 2019/0227230 A1 | 7/2019 | Novack et al. | |
| 2019/0288132 A1 | 9/2019 | Wang et al. | |
| 2019/0378874 A1 | 12/2019 | Rosenblatt et al. | |
| 2020/0066962 A1 | 2/2020 | Najafi | |
| 2020/0080890 A1 | 3/2020 | Najafi et al. | |
| 2020/0111944 A1 | 4/2020 | Moodera et al. | |
| 2020/0176662 A1 | 6/2020 | Dayton et al. | |
| 2020/0194656 A1 | 6/2020 | Najafi | |
| 2021/0239518 A1 | 8/2021 | Chung et al. | |

FOREIGN PATENT DOCUMENTS

| | | |
|---|---|---|
| DE | 2440576 B1 | 1/1976 |
| DE | 19714191 C1 | 7/1998 |
| EP | 0299879 A2 | 1/1989 |
| EP | 1965184 A1 | 9/2008 |
| GB | 2530500 A | 3/2016 |
| JP | S63299282 A | 12/1988 |
| JP | H0555647 A | 3/1993 |

(56) References Cited

FOREIGN PATENT DOCUMENTS

| WO | WO90/14715 A1 | 11/1990 |
|---|---|---|
| WO | WO94/09566 A1 | 4/1994 |
| WO | WO2012052628 A2 | 4/2012 |

OTHER PUBLICATIONS

Atikian, Haig A. et al., "Superconducting Nanowire Single Photon Detector on Diamond," arXiv: 1401.4490v1, physics.optics, Jan. 17, 2014, 5 pgs.
Cheng, Risheng et al., "Photon-Number-Resolving Detector Based on Superconducting Serial Nanowires," IEEE Transactions on Applied Superconductivity, vol. 23, No. 1, Feb. 2013, 9 pgs.
Clem, John R. et al., "Geometry-dependent critical currents in superconducting nanocircuits," arXiv: 1109.4881v1 [cond-mat.supr-con] Sep. 22, 2011, 29 pgs.
Dai, Daoxin et al., "Mode conversion in tapered submicron silicon ridge optical waveguides," Optics Express, vol. 20, No. 12, Jun. 4, 2012, 15 pgs.
Henrich, D. et al., "Geometry-inducted reduction of the critical current in superconducting nanowires," arXiv: 1204.0616v2 [cond-mat-supr-con] Aug. 22, 2012, 6 pgs.
Hortensius, H.L et al., "Critical-Current Reduction in Thin Superconducting Wires Due to Current Crowding," arXiv: 1203.4253v3, [cond-mat-supr-con], May 6, 2012, 5 pgs.
Korzh, B.A et al., "Demonstrating sub-3 ps temporal resolution in a superconducting nanowire single-photon detector," Apr. 18, 2018, 26 pgs,.
Lee, S.-B. et al., "Fabrication of a self-aligned superconducting nanotransistor based NOR logic gate," Microelectronic Engineering 57-58, 2001, 7 pgs., downloaded from https://www.sciencedirect.com/science/article/abs/pii/S0167931701004269).
Marsili, F., "Single-photon detectors based on ultra-narrow superconducting nanowires," Massachusetts Institute of Technology, Department of Electrical Engineering and Computer Science, Dec. 19, 2010, 31 pgs.
Mattioli, Francesco et al., "Photon-No. resolving superconducting nanowire detectors," Superconductor Science and Technology, Aug. 24, 2015, 16 pgs.
McGaughan, "Superconducting thin film nanoelectronics," Sep. 2015, Massachusetts Institute of Technology, submitted to the Department of Electrical Engineering and Computer Science in partial fulfillment of the requirements for the degree of Doctor of Philosophy in Electrical Engineering, 22 pgs.
Murphy et al., "Nanoscale superconducting memory based on the kinetic inductance of asymmetric nanowire loops," Department of Physics, University of Illinois at Urbana-Champaign, arXiv: 1701.08715v2 cond-mat.supr-con] 29Jun 2017, 19 pgs.
Natarajan et al., "Superconducting nanowire single-photon detectors: physics and applications", 2012, Superconduc. Sci. Technology vol. 25, p. 063001.
Quaranta et al., Superconductive Three-Terminal Amplifier/Discriminator, IEEE Transactions on Applied Superconductivity, vol. 19, No. 3, Jun. 2, 2009, 4 pgs.
Schmidt, E. et al., AIN-Buffered Superconducting NbN Nanowire Single-Photon Detector on GaAs, IEEE Transactions on Applied Superconductivity, vol. 27, No. 4, Jun. 2017, 5 pgs.
Shiino, Tatsuya et al., "Improvement of Critical Temperature of Superconducting NbTiN and NbN Thin Films Using the AIN Buffer Layer," Superconductor Science and Technology, Mar. 2010, 11 pgs.
Zhao, Qing-Yuan et al., "A compact superconducting nanowire memory element operated by nanowire cryotrons," Massachusetts Institute of Technology, Department of Electrical Engineering and Computer Science, Nov. 22, 2017, 20 pgs.
PsiQuantum Corp., International Search Report and Written Opinion, PCT/US2018/033042, Aug. 28, 2018, 13 pgs.
PsiQuantum Corp., International Search Report and Written Opinion, PCT/US2018/033041, Jul. 27, 2018, 16 pgs.
PsiQuantum Corp., International Search Report and Written Opinion, PCT/US2018/044091, Nov. 7, 2018, 13 pgs.
PsiQuantum Corp., Invitation to Pay Additional Fees/Partial Search Report, PCT/US2018/037892, Aug. 20, 2018, 12 pgs.
PsiQuantum Corp., Invitation to Pay Additional Fees/Partial Search Report, PCT/US2018/054414, Jan. 24, 2019, 21 pgs.
PsiQuantum Corp., International Search Report and Written Opinion, PCT/US2018/054414, Mar. 20, 2019, 21 pgs.
Najafi, Office Action dated Dec. 12, 2018, U.S. Appl. No. 16/028,288, 6 pgs.
Najafi, Notice of Allowance dated Apr. 5, 2019, U.S. Appl. No. 16/028,288, 10 pgs.
Najafi, Office Action dated Sep. 21, 2018, U.S. Appl. No. 16/028,293, 8 pgs.
Najafi, Final Office Action dated Mar. 1, 2019 U.S. Appl. No. 16/028,293, 5 pgs.
Najafi, Notice of Allowance dated Sep. 21, 2018, U.S. Appl. No. 16/012,520, 9 pgs.
Najafi, Office Action, U.S. Appl. No. 16/136,124, Apr. 4, 2019, 9 pgs.
Najafi, Quayle Office Action, U.S. Appl. No. 16/151,180, Jan. 31, 2019, 5pgs.
Najafi, Notice of Allowace, U.S. Appl. No. 16/151,180, Mar. 14, 2019, 5 pgs.
Najafi, Notice of Allowance U.S. Appl. No. 16/151,190, dated Feb. 6, 2019, 11 pgs.
Najafi, Notice of Allowance U.S. Appl. No. 16/151,190, dated Mar. 28, 2019, 5 pgs.
Najafi, Office Action, U.S. Appl. No. 16/046,815, Feb. 4, 2019, 9 pgs.
Najafi, Office Action, U.S. Appl. No. 16/046,807, Mar. 18, 2019, 10 pgs.
Najafi, Office Action, U.S. Appl. No. 16/107,143, Mar. 19, 2019, 11 pgs.
Psiquantum Corp., International Search Report and Written Opinion, PCT/US2019/017687, Apr. 30, 2019, 8 pgs.
Stanfield, CMOS-Compatible, Piezo-Optomechanically Tunable Photonics for Visible Wavelengths and Cryogenic, Temperatures, vol. 27, Issue 20, pp. 28588-28605, 2019.
PSIQUANTUM Corp., International Search Report, PCT/US2019/017691, Apr. 23, 2019, 7 pgs.
PSIQUANTUM Corp., International Search Report and Written Opinion, PCT/US2019/030019, Jul. 17, 2019, 8 pgs.
PSIQUANTUM Corp., PCT/US2018/044091, International Preliminary Report on Patentability, Jan. 28, 2020, 6 pgs.
Najafi, Non-Final Office Action, U.S. Appl. No. 16/664,716, Apr. 1, 2020, 14 pgs.
Psiquantum, International Search Report / Written Opinion, PCT/US2019/051853, Jan. 27, 2020, 13 pgs.
Psiquantum, International Preliminary Report on Patentability, PCT/US12018/033041, Nov. 26, 2019, 8 pgs.
Psiquantum, International Preliminary Report on Patentability, PCT/US2018/054414, Apr. 8, 2020, 15 pgs.
Psiquantum, International Search Report / Written Opinion, PCT/US2018/037892, Oct. 17, 2018, 18 pgs.
Psiquantum, International Preliminary Report on Patentability, PCT/US2018/037892, Dec. 17, 2019, 12 pgs.
Najafi, Non-Final Office Action, U.S. Appl. No. 16/553,068, Apr. 1, 2020, 11 pgs.
Najafi, Non-Final Office Action, U.S. Appl. No. 16/544,718, Aug. 17, 2020, 6 pgs.
Najafi, Non-Final Office Action, U.S. Appl. No. 16/656,506, Aug. 13, 2020, 18 pgs.
Najafi, Notice of Allowance, U.S. Appl. No. 16/553,068, Sep. 18, 2020, 8 pgs.
Najafi, Notice of Allowance, U.S. Appl. No. 16/473,550, Sep. 24, 2020, 8 pgs.
Najafi, Notice of Allowance, U.S. Appl. No. 16/473,550, Nov. 3, 2020, 2 pgs.
Najafi, Notice of Allowance, U.S. Appl. No. 16/553,068, Nov. 12, 2020, 2 pgs.
Najafi, Notice of Allowance, U.S. Appl. No. 16/656,506, Nov. 3, 2020, 12 pgs.

(56) References Cited

OTHER PUBLICATIONS

Najafi, Final Office Action, U.S. Appl. No. 16/664,716, 16OOT2020, 14 pgs.
Najafi, Notice of Allowance, U.S. Appl. No. 16/473,547, Dec. 9, 2020, 8 pgs.
Najafi, Notice of Allowance, U.S. Appl. No. 16/543,256, Dec. 9, 2020, 12 pgs.
Chung, Non-Final Office Action, U.S. Appl. No. 16/849,829, Aug. 21, 2020, 5 pgs.
Chung, Notice of Allowance, U.S. Appl. No. 16/849,829, Dec. 8, 2020, 5 pgs.
Psiquantum Corp., International Search Report/ Written Opinion, PCT/US20/28519, Jan. 12, 2021, 9 pgs.
Psiquantum Corp., Notice of Allowance, U.S. Appl. No. 16/849,829, Mar. 1, 2021, 8 pgs.
Psiquantum Corp., Notice of Allowance, U.S. Appl. No. 16/544,718, Feb. 5, 2021, 6 pgs.
Psiquantum Corp., Notice of Allowance, U.S. Appl. No. 16/664,716, Jan. 28, 2021, 8 pgs.
Psiquantum Corp., Notice of Allowance, U.S. Appl. No. 16/473,547, Jan. 27, 2021, 2 pgs.
Psiquantum Corp., Notice of Allowance, U.S. Appl. No. 16/543,256, Feb. 4, 2021, 2 pgs.
Psiquantum Corp., Notice of Allowance, U.S. Appl. No. 16/544,718, Mar. 12, 2021, 2 pgs.
Psiquantum Corp., Notice of Allowance, U.S. Appl. No. 16/544,718, Mar. 24, 2021, 2 pgs.
Psiquantum Corp., Notice of Allowance, U.S. Appl. No. 16/849,829, Apr. 5, 2021, 2 pgs.
Psiquantum, Notice of Allowance, U.S. Appl. No. 16/840,166, Mar. 23, 2021, 7 pgs.
Psiquantum, Notice of Allowance, U.S. Appl. No. 16/544,718, Apr. 26, 2021, 2 pgs.
Psiquantum, Notice of Allowance, U.S. Appl. No. 16/664,716, Apr. 21, 2021, 8 pgs.
Psiquantum, Notice of Allowance, U.S. Appl. No. 16/664,716, May 7, 2021, 2 pgs.
Psiquantum, Notice of Allowance, U.S. Appl. No. 16/543,256, Mar. 24, 2021, 2 pgs.
Psiquantum, Notice of Allowance, U.S. Appl. No. 16/575,274, Apr. 22, 2021, 10 pgs.
Psiquantum, International Preliminary Report on Patentability, PCT/US2018/033042, Nov. 19, 2019, 7 pgs.
Psiquantum, International Search Report, PCT/US2018/033041, Jul. 27, 2018, 12 pgs.
Psiquantum, International Preliminary Report on Patentability, PCT/US2019/051853, Mar. 23, 2021, 10 pgs.
Psiquantum, International Preliminary Report on Patentability, PCT/US2019/017687, Aug. 18, 2020, 6 pgs.
Psiquantum, International Preliminary Report on Patentability, PCT/US2019/030019, Nov. 3, 2020, 7 pgs.
Psiquantum, Notice of Allowance, U.S. Appl. No. 16/840,166, May 24, 2021, 5 pgs.
Najafi, Non-Final Office Action, U.S. Appl. No. 16/623,503, Jun. 23, 2021, 15 pgs.
Najafi, Notice of Allowance, U.S. Appl. No. 16/840,166, Jul. 21, 2021, 2 pgs.
Najafi, Non-Final Office Action, U.S. Appl. No. 17/135,861, Sep. 23, 2021, 6 pgs.
Psiquantum, International Preliminary Report on Patentability, PCT/US2019/016885, Aug. 11, 2020, 7 pgs.
Psiquantum, International Search Report and Written Opinion, PCT/US2019/016885, Apr. 24, 2019, 9 pgs.
Thompson, Non-Final Office Action, U.S. Appl. No. 16/450,911, Aug. 2, 2019, 6 pgs.
Thompson, Notice of Allowance, U.S. Appl. No. 16/450,911, Dec. 11, 2019, 5 pgs.
Thompson, Non-Final Office Action, U.S. Appl. No. 16/985,137, Sep. 30, 2021, 6 pgs.
Najafi, Notice of Allowance, U.S. Appl. No. 16/046,807, 2900T2019, 7 pgs.
Najafi, Notice of Allowance, U.S. Appl. No. 16/136,124, Apr. 4, 2019, 8 pgs.
Najafi, Notice of Allowance, U.S. Appl. No. 16/136,124, Jun. 27, 2019, 8 pgs.
Najafi, Corrected Notice of Allowance, U.S. Appl. No. 16/136,124, Sep. 23, 2019, 2 pgs.
PSIQUANTUM Corp., International Search Report and Written Opinion, PCT/US2018/060802, Apr. 8, 2019, 6 pgs.
Psiquantum, International Preliminary Report on Patentability, PCT/US2018/060802, May 19, 2020, 13 pgs.
Najafi, Notice of Allowance, U.S. Appl. No. 17/195,522, Nov. 12, 2021, 8 pgs.
Najafi, Notice of Allowance, U.S. Appl. No. 17/195,522, Nov. 16, 2021, 2 pgs.
Chung, Non-Final Office Action, U.S. Appl. No. 17/232,086, Dec. 16, 2021, 6 pgs.
Najafi, Notice of Allowance, U.S. Appl. No. 17/195,522, Dec. 9, 2021, 2 pgs.
Najafi, Notice of Allowance, U.S. Appl. No. 17/705,201, May 31, 2024, 9 pgs.
Najafi, Notice of Allowance, U.S. Appl. No. 18/383,009, Jul. 31, 2024, 10 pgs.

* cited by examiner

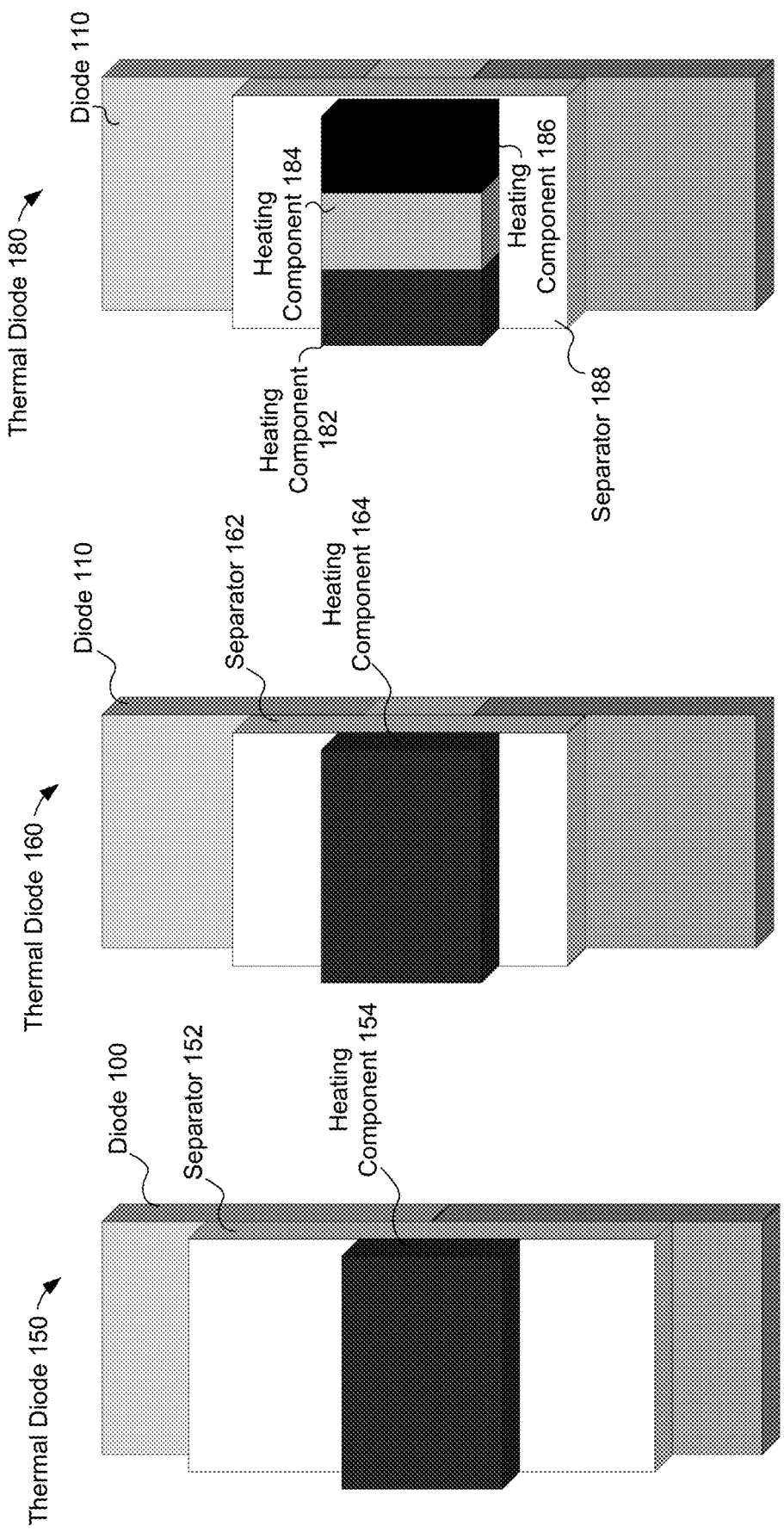

Reverse-Bias (Geiger Mode)

Reverse-Bias Geiger with A/C Coupling (e.g., $V_{bias} = V_{BiasTee}$)

Reverse-Bias (Linear Mode)

PHOTON NUMBER RESOLVING DETECTOR WITH THERMAL DIODE

RELATED APPLICATIONS

This application is a continuation of U.S. application Ser. No. 17/705,201, filed Mar. 25, 2022, which is a continuation of U.S. application Ser. No. 16/773,921, filed Jan. 27, 2020, now U.S. Pat. No. 11,289,590, which claims priority to U.S. Provisional Application No. 62/798,983, filed Jan. 30, 2019, each of which is hereby incorporated by reference in its entirety.

This application is related to U.S. application Ser. No. 16/046,807, filed Jul. 26, 2018, now U.S. Pat. No. 10,586,910, entitled "Superconductor-Based Transistor," and to U.S. application No. Ser. No. 16/136,124, filed Sep. 19, 2018, now U.S. Pat. No. 10,461,445, entitled "Methods and Devices for Impedance Multiplication," each of which is incorporated by reference herein in its entirety.

TECHNICAL FIELD

This relates generally to diodes, including but not limited to, thermally-activated diodes.

BACKGROUND

A diode is a device used to conduct current primarily in one direction, e.g., has low resistance in the one direction and high resistance in the other. A semiconductor diode is a diode made of a p-type material and an n-type material with a junction in-between. A semiconductor diode may also operate as a switch in response energy received at the junction.

Superconductors are materials capable of operating in a superconducting state with zero electrical resistance under particular conditions. Additionally, in some circumstances, superconductors generate heat when not in a superconducting state.

SUMMARY

There is a need for systems and/or devices with more efficient and effective methods for providing the functionality of a diode switch. Such systems, devices, and methods optionally complement or replace conventional systems, devices, and methods for providing the functionality of a diode switch.

As an example, in accordance with some embodiments, a diode, such as a P—N diode, is thermally coupled to a heat source, such as a resistor. In this example, the resistor is thermally coupled to the P-N junction of the diode. A resistor generates resistive heat as current flows through the resistor. The resistor in this example is thermally-coupled to the P-N junction so that resistive heat from the resistor is transferred to the P-N junction portion of the diode. The diode and resistor are configured (e.g., sized and doped) so that the band gap for the diode corresponds to the thermal energy (e.g., corresponding to a thermal wavelength) of the resistive heat. In other words, the thermal energy from the resistor is absorbed by the diode to generate a current flow. The characteristics of this current flow vary depending on a bias of the diode, e.g., whether the diode is reverse biased with a magnitude of the reverse bias voltage across the diode greater than (sometimes said to be beyond) a magnitude of a breakdown voltage (also sometimes called Geiger mode), reverse biased with a magnitude of the reverse bias voltage across the diode less than (sometimes said to be below) a magnitude of the breakdown voltage (also sometimes called linear mode), or forward-biased.

In one aspect, some embodiments include an electrical circuit including: (1) a diode component having a particular energy band gap; (2) an electrical source electrically coupled to the diode component and configured to bias the diode component in a particular state; and (3) a heating component thermally coupled to a junction of the diode component and configured to selectively supply heat corresponding to the particular energy band gap.

In another aspect, some embodiments include a method for operating a diode. The method includes: (1) thermally-coupling a heating component to a diode component; (2) maintaining the diode component in a particular state; and (3) generating heat at the heating component, where the heat is transferred to the diode component to enable current flow through the diode component.

Thus, devices and systems are provided with methods for fabricating and operating diodes, thereby increasing the effectiveness, efficiency, and user satisfaction with such systems, devices, and methods.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

FIGS. 1C-1E are perspective diagrams illustrating components of representative thermal diodes in accordance with some embodiments.

DETAILED DESCRIPTION

Figure 1B:
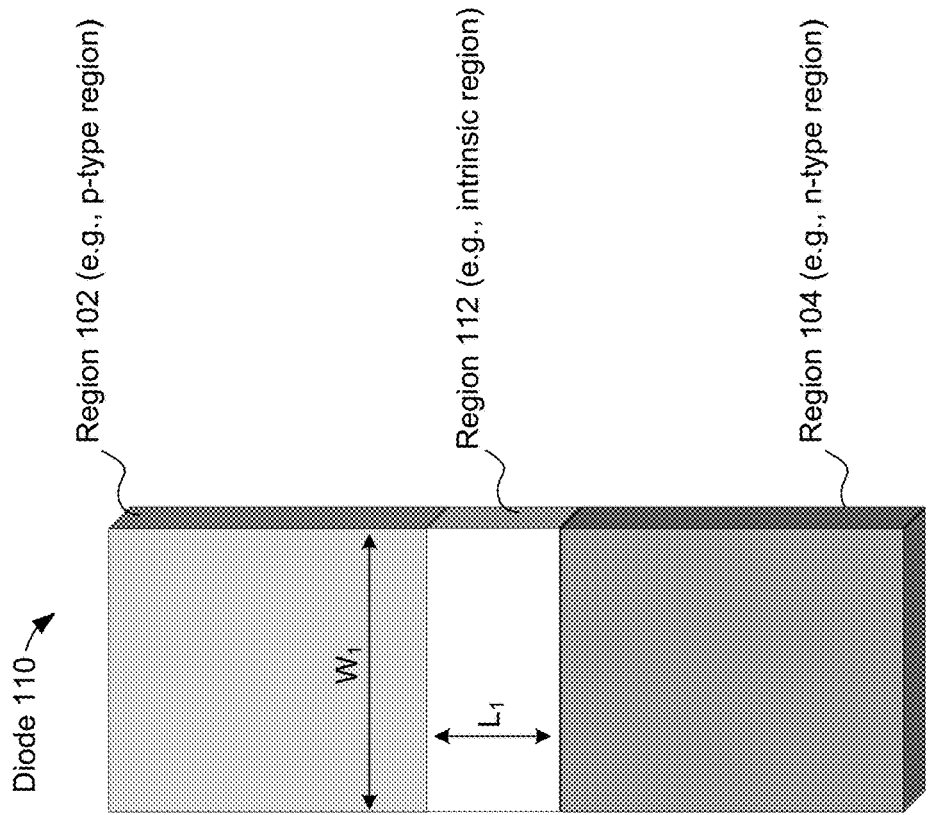
FIGS. 1A-1B are perspective diagrams illustrating components of representative diodes in accordance with some embodiments.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

High voltage drivers (e.g., driving 10V-30V) at cryogenic temperatures (e.g., less than 10 Kelvin) are challenging to implement using conventional CMOS techniques. However, some quantum systems require high voltage drivers to drive optical switches within the quantum system. As described in detail below, the thermal diodes disclosed herein optionally operate as high voltage drivers at cryogenic temperatures. Additionally, in some systems it is necessary to resolve the number of photons detected at a particular time, or within a particular time window. As described in detail below, the thermal diodes disclosed herein optionally operate as photon number resolving detectors. Superconductors conduct current at cryogenic temperatures, but the current does not have directionality and therefore will travel to locations of least potential. As described in detail below, the thermal diodes disclosed herein optionally provide a unidirectional current for readout circuit(s). Moreover, the thermal diodes disclosed herein optionally operate in temperatures ranging from 10 Kelvin to 100 Kelvin, which are generally higher temperatures than the temperatures in which superconductors can operate in a superconducting state.

The present disclosure describes circuits that include a diode thermally coupled to a heat source. In various embodiments, the diode is a P—N diode, a PIN diode, a modified single-photon avalanche diode (SPAD), or a modified avalanche photodiode (APD). In various embodiments, the heat source is a semiconductor resistor, a superconductor that selectively operates in a non-superconducting state during which it generates resistive heat as current flows through it, or other device that generates thermal energy. In some embodiments, the heat source is coupled to a photon detector, such as a superconducting nanowire single-photon detector (SNSPD), so as to generate heat in response to photon(s) received at the SNSPD. The thermal energy (e.g., resistive heat) from the heat source is absorbed by the diode to generate a current flow. As discussed in detail below, the characteristics of this current flow vary depending on a bias of the diode, e.g., whether the diode is reverse biased with a magnitude of the reverse bias voltage greater than (sometimes called beyond) a magnitude of a breakdown voltage (also sometimes called Geiger mode), reverse biased with a magnitude of the reverse bias voltage less than (sometimes called below) a magnitude of the breakdown voltage (also sometimes called linear mode), or forward-biased. A diode that is thermally coupled to a heat source is also sometimes referred to herein as a "thermally-activated diode" or a "thermal diode."

The present disclosure also describes diode devices that utilize a freeze-out property of semiconductors in conjunction with heat generation to achieve switch functionality. As an example, in accordance with some embodiments, such as embodiments in which the diode is forward-biased, a diode is composed of one or more semiconducting materials and is thermally-coupled to a superconductor. In this example, the semiconducting material is initially maintained at a temperature below a critical temperature for current flow through the semiconducting material (representing an "off" state for the diode and sometimes referred to as a "freeze-out state"). The superconductor in this example is initially in a superconducting state. While in the superconducting state, a current is introduced to the superconductor that exceeds a critical current for the superconductor. As a result, the superconductor transitions to a non-superconducting state. During the transition and while in the non-superconducting state, the superconductor generates heat sufficient to heat the semiconducting material of the diode above the critical temperature for current flow. The increase in temperature thus allows current flow through the diode (representing an "on" state for the diode).

As used herein, a "superconducting" material is a material that is capable of operating in a superconducting state (under particular conditions). For example, a superconducting material is a material that operates as a superconductor (e.g., operates with zero electrical resistance) when cooled below a threshold temperature (e.g., a critical temperature) and having less than a threshold current flowing through it. A superconducting material is also called herein a superconduction-capable material. The superconducting materials may also operate in an "off" state where little or no current is present. In some embodiments, the superconducting materials operate in a non-superconducting state during which the materials have a non-zero electrical resistance (e.g., a resistance in the range of one thousand to ten thousand ohms). For example, a superconducting material supplied with a current greater than a threshold superconducting current for the superconducting material may transition from a superconducting state with zero electrical resistance to a non-superconducting state with non-zero electrical resistance.

As used herein, a semiconducting component is deemed to be in an "on" state when the semiconducting component is at a temperature above a threshold temperature of a semiconducting material. A semiconducting component has a relatively low resistance at temperatures above the threshold temperature of the semiconducting material. The semiconducting component is deemed to be in an "off" or "frozen" state when the semiconducting component is at a temperature below the threshold temperature of a semiconducting material. For example, the semiconducting component has a relatively high resistance at temperatures below the threshold temperature of the semiconducting material. A superconducting threshold temperature for a superconductor component is independent of a semiconducting threshold temperature for a semiconductor material.

As used herein, a "wire" is a section of material configured for transferring electrical current. In some embodiments, a wire includes a section of material conditionally capable of transferring electrical current (e.g., a wire made of a superconducting material that is capable of transferring electrical current while the wire is maintained at a temperature below a critical temperature). A cross-section of a wire (e.g., a cross-section that is perpendicular to a length of the wire) optionally has a geometric (e.g., flat or round) shape or an irregular (also sometimes called a non-geometric) shape. In some embodiments, a length of a wire is greater than a width or a thickness of the wire (e.g., the length of a wire is at least 5, 6, 7, 8, 9, or 10 times greater than the width and the thickness of the wire).

As used herein, the term "light intensity" or simply "intensity" refers to the number of photons incident on a unit area, e.g., a superconducting wire, per unit time. The term "intensity" includes a situation where only a single photon is incident on the detector in a given time period and also includes a situation where multiple photons are incident on the detector in the given time period. For example, a first light pulse having a first intensity that is greater than a second light pulse having a second intensity includes a first light pulse that includes more photons than a second light pulse. For example, the first light pulse can include 10 photons or 100 photons, while the second light pulse can include one photon, two photons, . . . , 9 photons, etc.

Figure 1A:
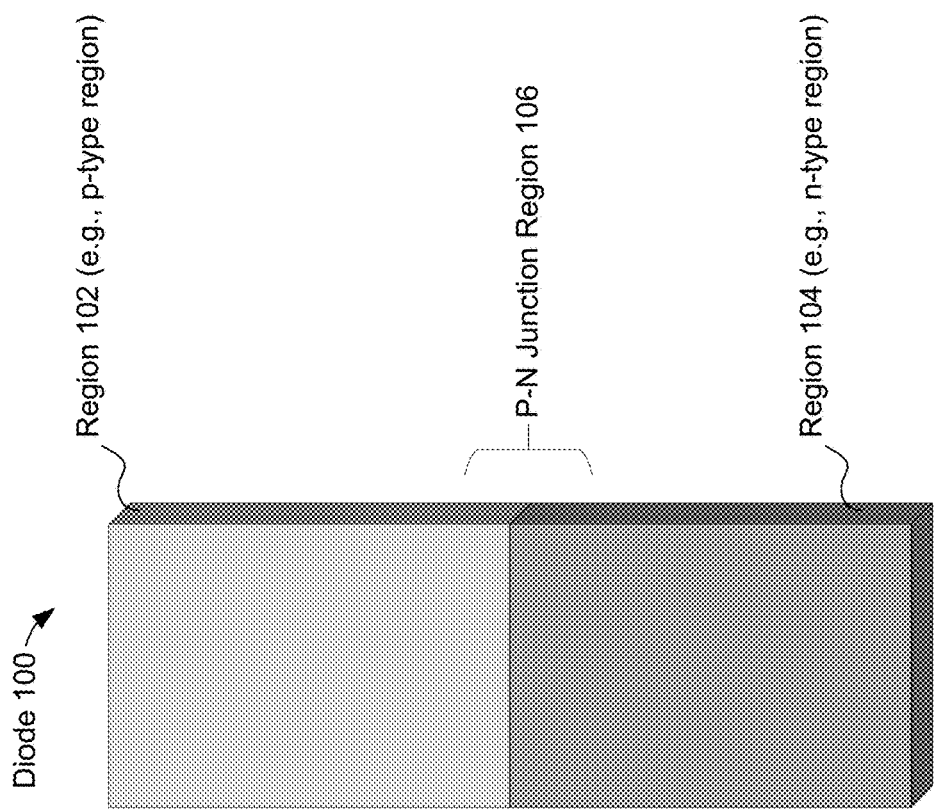

Turning now to the figures, FIGS. 1A-1B are perspective diagrams illustrating components of representative diodes in accordance with some embodiments. FIG. 1A shows a semiconductor P—N diode 100 with a region 102 (e.g., a p-type region), a region 104 (e.g., an n-type region), and a P-N junction region 106. For example, a p-type region is a region of a semiconductor that has been doped (or grown) with an element that creates acceptor impurities (holes) in the lattice. An n-type region is a region of a semiconductor that has been doped (or grown) with an element that creates donor impurities (free electrons) in the lattice. The P-N junction 106 is an interface between the p-type region and the n-type region. In some embodiments, one of the regions 102 and 104 is a doped well within a larger semiconductor lattice. In some embodiments, the semiconductor diode 100 is composed of silicon or germanium. In some embodiments, the semiconductor diode 100 is a heterojunction diode (e.g., when region 102 and region 104 are composed of materials having different band gaps). In some embodiments, one or more regions of the diode 100 have a thickness in the range of 5 nanometers (nm) to 1 micron (µm). In some embodiments, one or more regions of the diode 100 have a width in the range of 50 nm to 50 µm. In some embodiments, one or more regions of the diode 100 have a length in the range of 100 nm to 100 µm. In some embodiments, contacts (not shown) are connected to the regions 102 and 104.

FIG. 1B shows a semiconductor PIN diode 110 with the region 102, the region 104, and a region 112 (e.g., an intrinsic region). For example, the intrinsic region is an undoped region between the n-type region and the p-type region. In some embodiments, the semiconductor diode 110 is composed of silicon or germanium. In some embodiments, one or more regions of the diode 110 have a thickness in the range of 5 nm to 1 µm. In some embodiments, one or more regions of the diode 110 have a width in the range of 50 nm to 50 µm. For example, the region 102 optionally has a width, denoted $W_1$, in the range of 50 nm to 50 µm. In some embodiments, the regions 102 and 104 of the diode 110 have a length in the range of 100 nm to 100 µm. In some embodiments, the region 112 has a length, denoted $L_i$, in the range of 10 nm to 50 µm.

FIGS. 1C-1E are perspective diagrams illustrating components of representative thermal diodes in accordance with some embodiments. FIG. 1C shows a thermal diode 150 with the diode 100 from FIG. 1A thermally-coupled to a heating component 154. In accordance with some embodiments, the heating component 154 is vertically stacked with the diode 100 with a separator 152 in between. In some embodiments, the heating component 154 is adjacent to the P-N junction 106 of the diode 100. In some embodiments, the heating component 154 is positioned over, under, or beside the P-N junction 106 so as to be thermally coupled to the P-N junction 106. In some embodiments, such as when the semiconductor diode 100 is a heterojunction diode, the heating component 154 is located close to region 112 (e.g., the intrinsic region). In some embodiments, the heating component 154 is a resistor or other source of joule heating. In some embodiments, the heating component 154 is configured to generate less than 1 Watt (W) of heat energy. In some embodiments, the heating component 154 is configured to generate heat energy in the range of 100 nanoWatts (nW) to 10 milliWatts (mW).

In some embodiments, the separator 152 comprises a thermally-conductive and electrically insulating material (e.g., a dielectric such as SiO2). In some embodiments, the separator 152 is a dielectric layer. In some embodiments, the separator 152 is carbon (e.g., diamond). In some embodiments, the separator 152 is a layer of aluminum nitride (AlN). In some embodiments, the separator 152 has a thickness between 5 nm and 20 nm. In some embodiments, the separator 152 has a thickness sufficient to inhibit tunneling effects between the heating component 154 and the diode 100, and short enough so as to be less than a mean free path of the thermal energy generated by the heating component. For example, in some embodiments, the separator 152 has a thickness in the range of 5 nm to 1 micron. In some embodiments, the separator 152 is thermally conductive. In some embodiments, the heating component 154 is a resistive element, such as a resistor composed of semiconducting or metallic materials. In some embodiments, the heating component 154 is a superconducting component (e.g., composed of niobium) that transitions to a non-superconducting state to generate resistive heat. In some embodiments, the heating component 154 has a length in the range of 10 nm to 10 µm. In some embodiments, the heating component 154 has a thickness in the range of 5 nm to 20 nm. In some embodiments, the heating component 154 has a width in the range of 10 nm to 50 µm.

In some embodiments, the diode 100 and heating component 154 are configured (e.g., sized, positioned, and doped) so that the band gap for the diode 100 corresponds to the thermal energy (e.g., corresponding to a thermal wavelength) of the heat (e.g., phonons) generated by the heating component 154. In other words, the thermal energy from the heating component is absorbed by the diode to generate a corresponding current flow. In some embodiments, the diode 100 is configured (e.g., sized and doped) so that photons of other energies, e.g., 0.8 electron volts (eV) or $1.3 \times 10^{-19}$ Joules (J) (corresponding to light having 1550 nanometer wavelength, used in some quantum systems), are not absorbed by the diode 100.

FIG. 1D shows a thermal diode 160 similar to the thermal diode 150 of FIG. 1C, except that the thermal diode 160 includes a PIN diode 110 rather than a P—N diode (e.g., a heating component 164 is vertically stacked with the diode 110 with a separator 162 in between). As shown in FIG. 1D, the heating component 164 is arranged over the intrinsic region 112. In some embodiments, the heating component 164 is positioned over, under, or beside the intrinsic region so as to be thermally coupled to the intrinsic region.

FIG. 1E shows a thermal diode 180 including a PIN diode 110 thermally coupled to heating components 182, 184, and 186 (e.g., heating components 182, 184, and 186 are vertically stacked over the diode 110 with a separator 188 in between). In some embodiments, the thermal diode 180 is utilized for photon number resolving, where each heating component is coupled to a photon detector, as will described below with respect to FIG. 5B. In some embodiments, the heating components 182, 184, and 186 are configured to generate substantially similar amounts of heat (e.g., within 20%, 10%, or 5%). For example, in some embodiments, each heating component has substantially similar sizing (e.g., within 20%, 10%, or 5%) and is approximately equal distance from the diode 110 (e.g., within 5 nm, 10 nm, or 20 nm) so that the heat transfer is substantially similar.

Figure 2A:
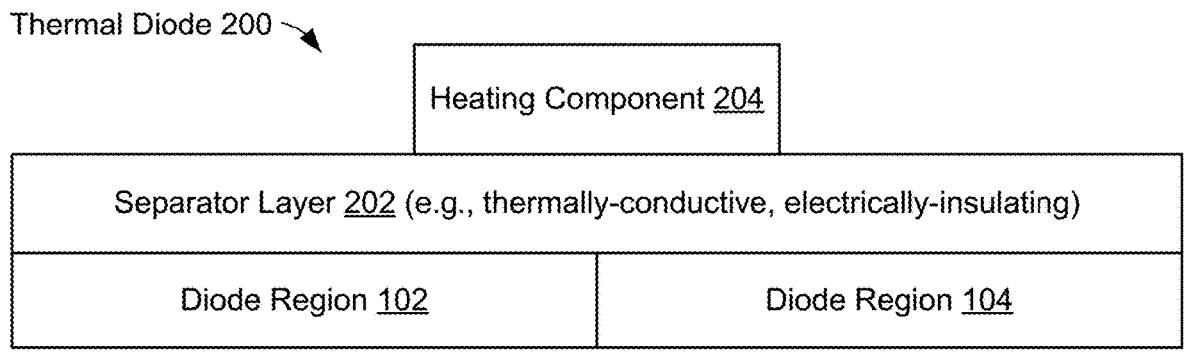
FIGS. 2A-2D are cross-sectional diagrams illustrating components of representative thermal diodes in accordance with some embodiments.
Figure 2B:
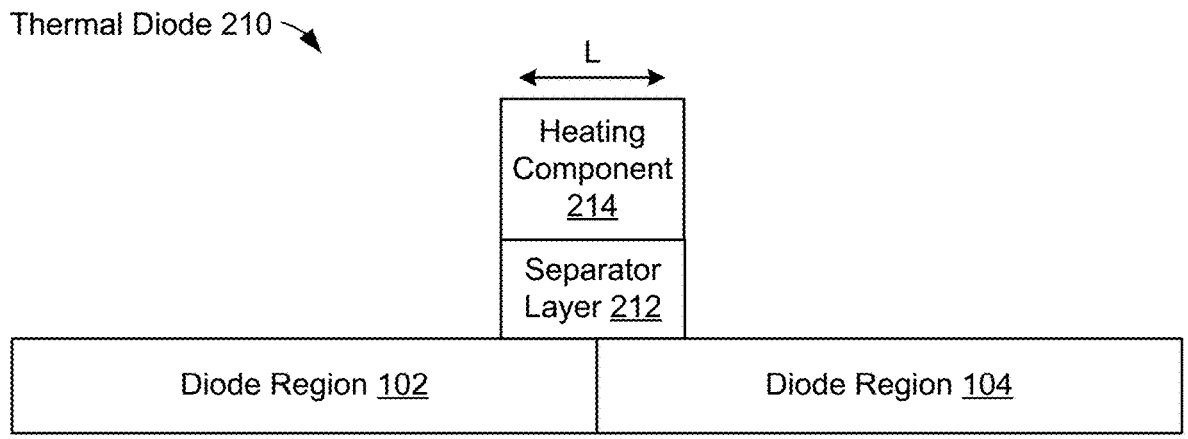
Figure 2C:
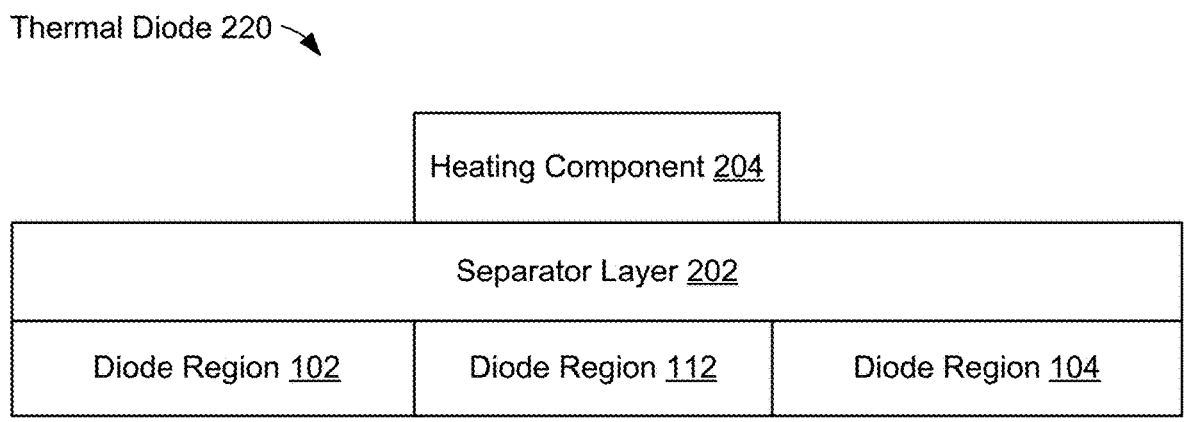

FIGS. 2A-2D are cross-sectional diagrams illustrating components of representative thermal diodes in accordance with some embodiments. FIG. 2A shows a thermal diode 200 corresponding to the thermal diode in FIG. 1C, except that the separator layer 202 spans the top of the regions 102 and 104. In some embodiments, the separator layer 202 is a dielectric layer deposited over the diode device(s) (e.g., deposited over the diodes in FIGS. 1A-1B). FIG. 2B shows a thermal diode 210 corresponding to the thermal diode in FIG. 2A, except that the separator layer 212 and the heating component 214 have a shorter length, denoted L, than the separator layer 202 and the heating component 204 of FIG. 2A (e.g., the separator layer 212 does not span the top of the regions 102 and 104). FIG. 2C shows a thermal diode 220 corresponding to the thermal diode in FIG. 1D, except that the separator layer 202 spans the top of the regions 102 and 104. FIG. 2C further shows the heating component 204 having a same length as the diode region 112, however, in some embodiments, the heating component 204 has a different length than the diode region 112 (e.g., is shorter or longer than the diode region 112).

Figure 2D:
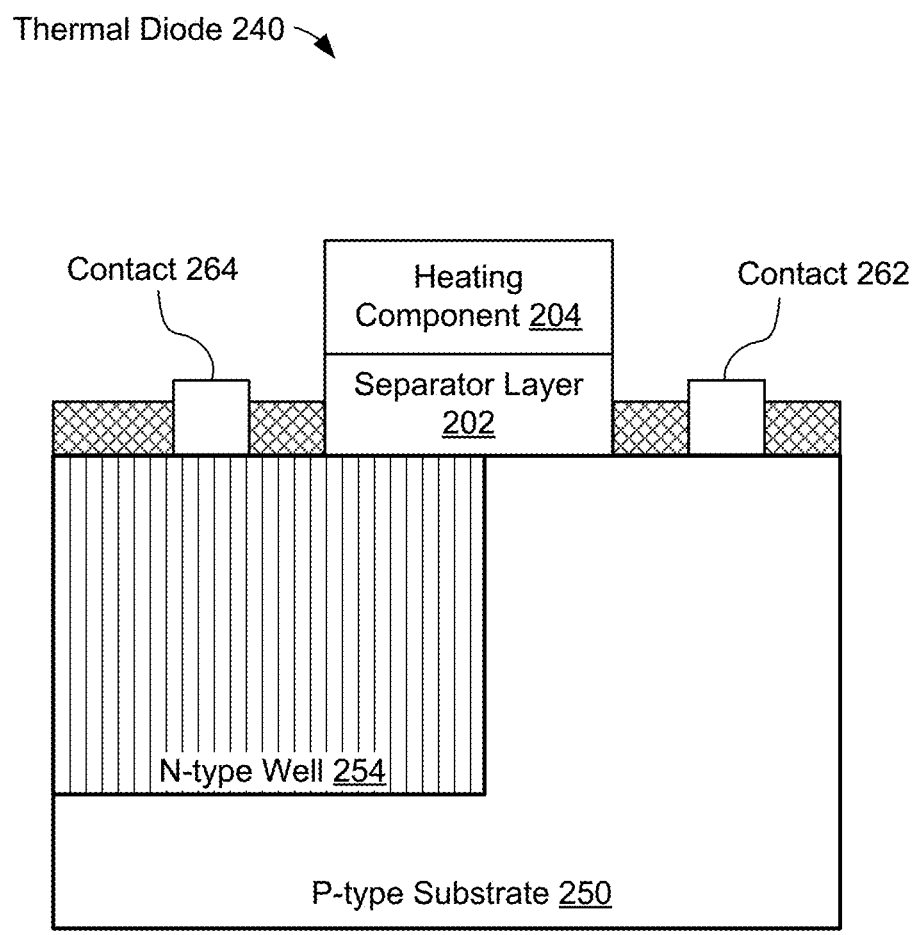

FIG. 2D shows a thermal diode 240 including a p-type substrate 250 (e.g., corresponding to a p-type region) and an n-type well 254 within the substrate 250 (e.g., corresponding to an n-type region). The thermal diode 240 further includes a heating component 204 thermally-coupled to the interface between the n-type well 254 and the p-type substrate 250 (e.g., a P-N junction). FIG. 2D further shows a contact 264 coupled to the N-type well 254 (e.g., corresponding to a cathode of the diode) and a contact 262 coupled to the P-type substrate 250 (e.g., corresponding to an anode of the diode).

Figure 3A:
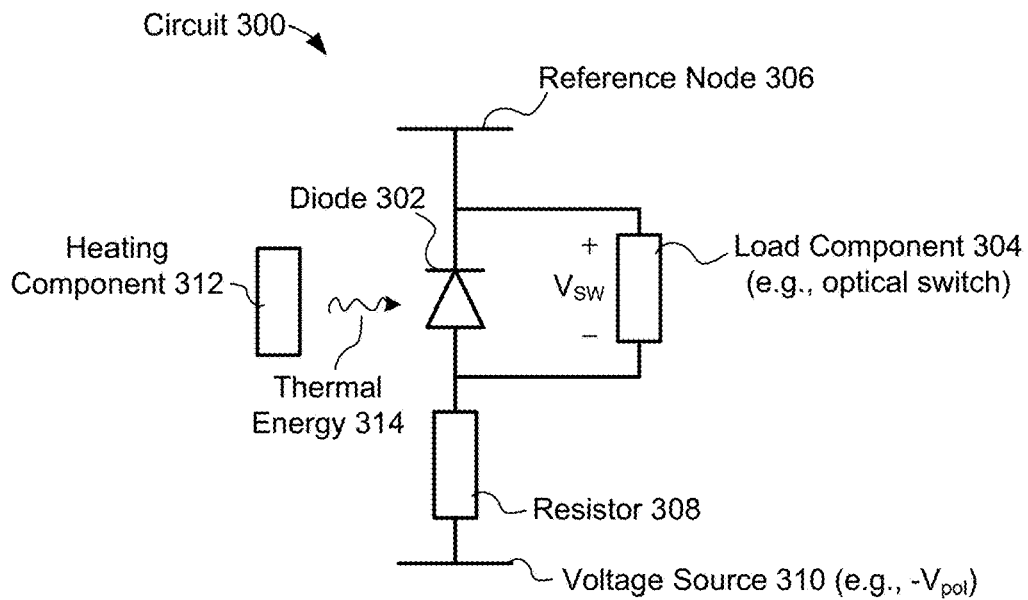
FIGS. 3A-3D are schematic diagrams illustrating representative circuits in accordance with some embodiments.

FIGS. 3A-3D are plan view schematic diagrams illustrating representative circuits in accordance with some embodiments. FIG. 3A shows a circuit 300 that includes a heating component 312 thermally coupled to a diode 302, so as to be able to transfer thermal energy 314 to the diode 302. For example, the heating component 312 optionally corresponds to the heating component 154 in FIG. 1C or the heating component 164 in FIG. 1D. In this example, the diode 302 optionally corresponds to the diode 100 or the diode 110. In some embodiments, the diode 302 is a P—N diode, a PIN diode, or a heterojunction diode. In accordance with some embodiments, the circuit 300 includes a voltage source 310 electrically coupled to the diode 302 (e.g., to the anode of the diode 302) via a resistor 308. In some embodiments, the resistor 308 is removed from the circuit 300. In some embodiments, the resistor 308 is coupled in another configuration with the diode 302, e.g., between the diode 302 and the reference node 306. In some embodiments, the circuit 300 includes one or more additional components that is coupled, either in series or in parallel, to the diode 302. The one or more additional components may include passive devices, such as an inductor or a capacitor, and/or active devices, such as a rectifier or a transistor. In some embodiments, the circuit may also include or be electrically coupled to, either in series or in parallel, one or more of an active reset circuit and/or an active quenching circuit.

In some embodiments, the voltage source 310 is configured to supply a bias voltage (e.g., $-V_{pol}$) to the diode 302. In some embodiments, the bias voltage selectively biases the diode 302 in an avalanche reverse-bias mode (e.g., a Geiger mode), a linear reverse-bias mode, or a forward-bias mode. In some embodiments, the reference node 306 is an electrical ground. In some embodiments, a load component 304 is coupled to the diode 302. As shown in FIG. 3A, the load component 304 is coupled in parallel with the diode 302 in accordance with some embodiments. In some embodiments, the load component 304 is an optical switch (e.g., an N-to-1 switch) configured to selectively couple input waveguides to an output waveguide. An optical switch will be discussed in more detail below with respect to FIGS. 9A-9B.

In accordance with some embodiments, an avalanche reverse-bias mode corresponds to the voltage source 310 complying with Equation 1 below.

$$|V_{pol}| = |V_{BD}| + |V_{EX}|$$

Equation 1—Bias Voltage for Avalanche Reverse-Bias Mode Diode

In the avalanche reverse-bias mode, the voltage source 310 supplies a negative voltage to the diode, denoted $-V_{pol}$, that, as shown in Equation 1, has a magnitude that exceeds the magnitude of the breakdown voltage, $V_{BD}$, for the diode 302 by an amount equal to a magnitude of an excess voltage, $V_{EX}$, sometimes called the overdrive voltage. In some embodiments, the magnitude of $V_{BD}$ is in the range of 5 volts (V) to 100 V. In some embodiments, the magnitude of $V_{EX}$ is in the range of 1 V to 10 V. In accordance with some embodiments, the breakdown voltage for a diode is the largest reverse voltage that can be applied to a diode without causing an exponential increase in the reverse (leakage) current through the diode.

Figure 3B:
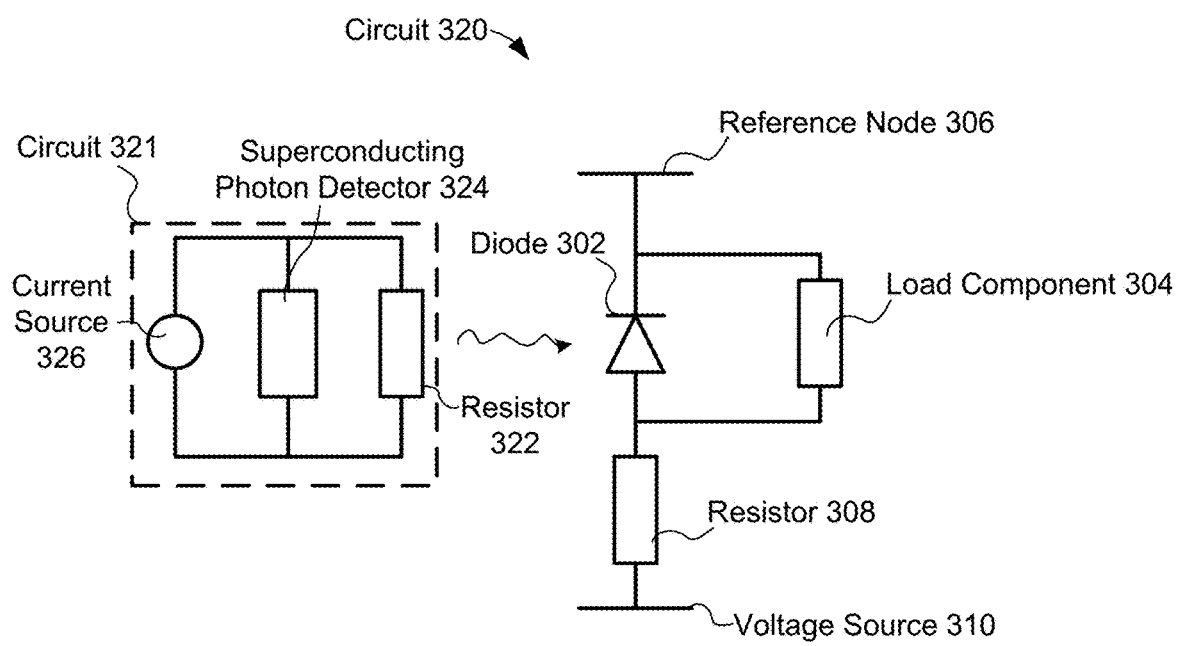

FIG. 3B shows a circuit 320 where the heating component 312 of FIG. 3A is replaced with a circuit 321. The circuit 321 includes a current source 326, a superconducting photon detector 324 (e.g., a superconducting wire), and a resistor 322. In accordance with some embodiments, the current source 326 is configured to supply a current to the superconducting photon detector 324 that maintains the superconducting photon detector 324 in a superconducting state in the absence of incident photons. In some embodiments, an incident photon causes the superconducting photon detector 324 to transition from the superconducting state to a non-superconducting (resistive) state. While the superconducting photon detector 324 is in a non-superconducting state at least a portion of the current from the current source 326 flows through the resistor 322, which generates resistive heat. At least a portion of the resistive heat generated by the resistor 322 transfers to the diode 302 (e.g., as thermal energy 314).

Figure 3C:
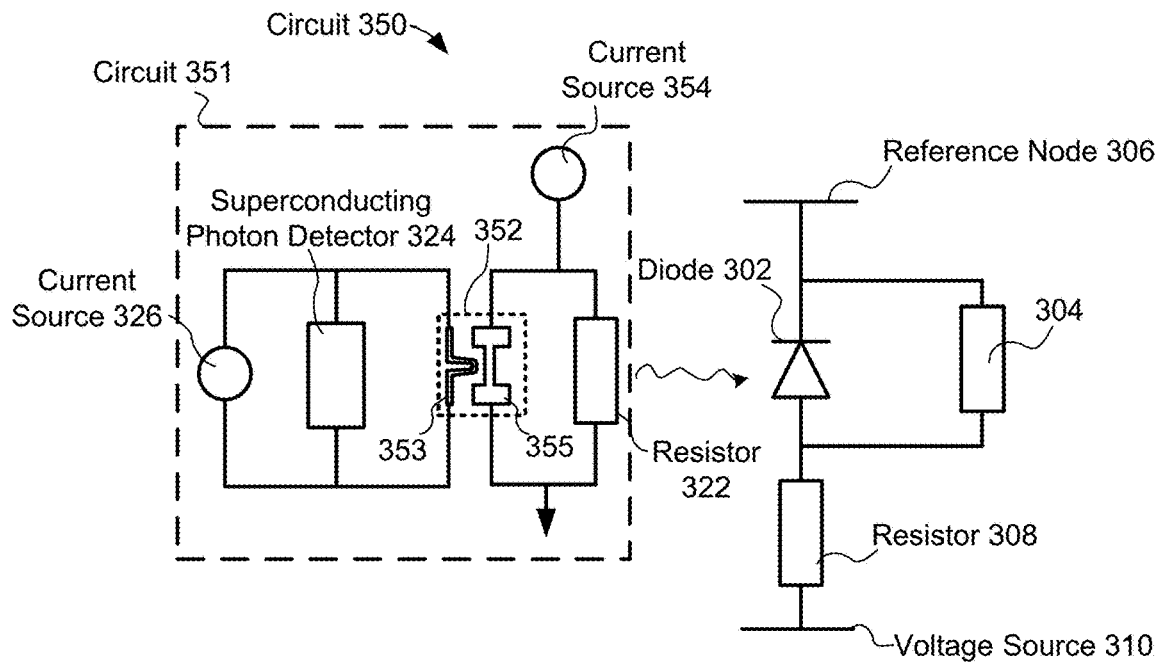

FIG. 3C shows a circuit 350 where the heating component 312 of FIG. 3A is replaced with a circuit 351. The circuit 351 includes the current source 326, the superconducting photon detector 324, and the resistor 322. The circuit 351 further includes a heat transfer component 352 and a current source 354. In accordance with some embodiments, the current source 354 is configured to generate a larger current than the current source 326 (e.g., 5 times, 10 times, or 100 times larger).

In accordance with some embodiments, the heat transfer component 352 includes a superconducting component 355 and a heat source 353, e.g., another superconducting component. FIG. 3C further shows the heat source 353 coupled in parallel with the superconducting photon detector 324 and the superconducting component 355 coupled in parallel with the resistor 322. In accordance with some embodiments, the heat transfer component 352 is configured to transition the superconducting component 355 from a superconducting state to a non-superconducting state in response to current received from the current source 326 while the superconducting photon detector 324 is in the non-superconducting (e.g., in response to current redirected from the superconducting photon detector 324 to the heat source 353). In accordance with some embodiments, increased current flows through the resistor 322 from the current source 354 while the superconducting component 355 is in a non-superconducting state (as compared to when the superconducting component 355 is in the superconducting state). The increased current flow results in additional resistive heat generated by the resistor 322 (and transferred to the diode 302).

In some embodiments, the superconducting component 355 and the heat source 353 are thermally-coupled and electrically-insulated. In some embodiments, the superconducting component 355 and the heat source 353 are positioned so as to allow heat transfer between one another but inhibit or prevent electrons from transferring (e.g., via tunneling or Cooper pairs). In some embodiments, the heat source 353 is a superconductor, while in some other embodiments, heat source 353 is a non-superconducting component, e.g., a resistive component formed from a metal material, a semiconducting material, or any other resistive material. In some embodiments, heat source 353 comprises a metal and/or doped semiconductor. Additional details regarding operation of the heat transfer component 352 and related heat source circuits are disclosed in U.S. application Ser. No. 16/136,124, filed Sep. 19, 2018, entitled "Methods and Devices for Impedance Multiplication," which is incorporated by reference in its entirety. In some embodiments, (not shown) the superconducting component 355 is thermally-coupled with the diode 302 rather than the resistor 322.

Figure 3D:
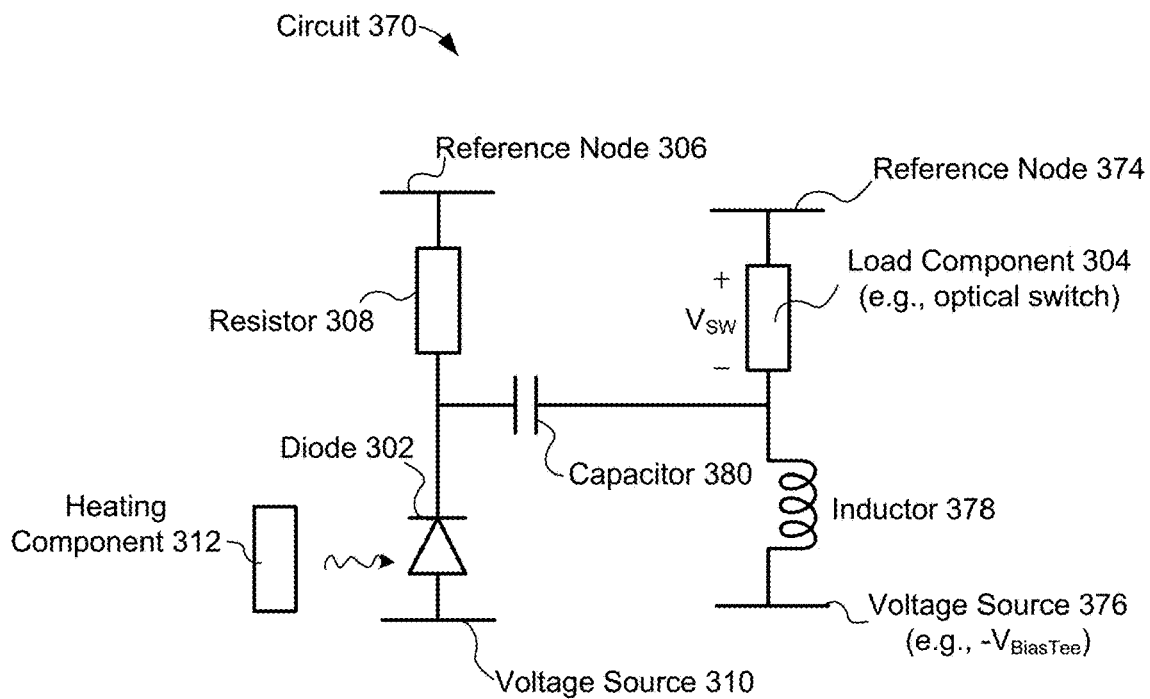

FIG. 3D shows a circuit 370 where the load component 304 is AC coupled to the diode 302. The circuit 370 includes the diode 302 thermally-coupled to the heating component 312. The circuit 370 also includes the resistor 308 coupled in series with the diode 302 between the voltage source 310 and the reference node 306. The circuit 370 further includes a capacitor 380 coupling a series combination of the load component 304 and an inductor 378 to the diode 302. The inductor 378 and the load component 304 are coupled between a voltage source 376 and a reference node 374 (e.g., an electrical ground). In some embodiments, the circuit 370 may also include or be electrically coupled to one or more of an active reset circuit and an active quenching circuit.

Figure 4A:
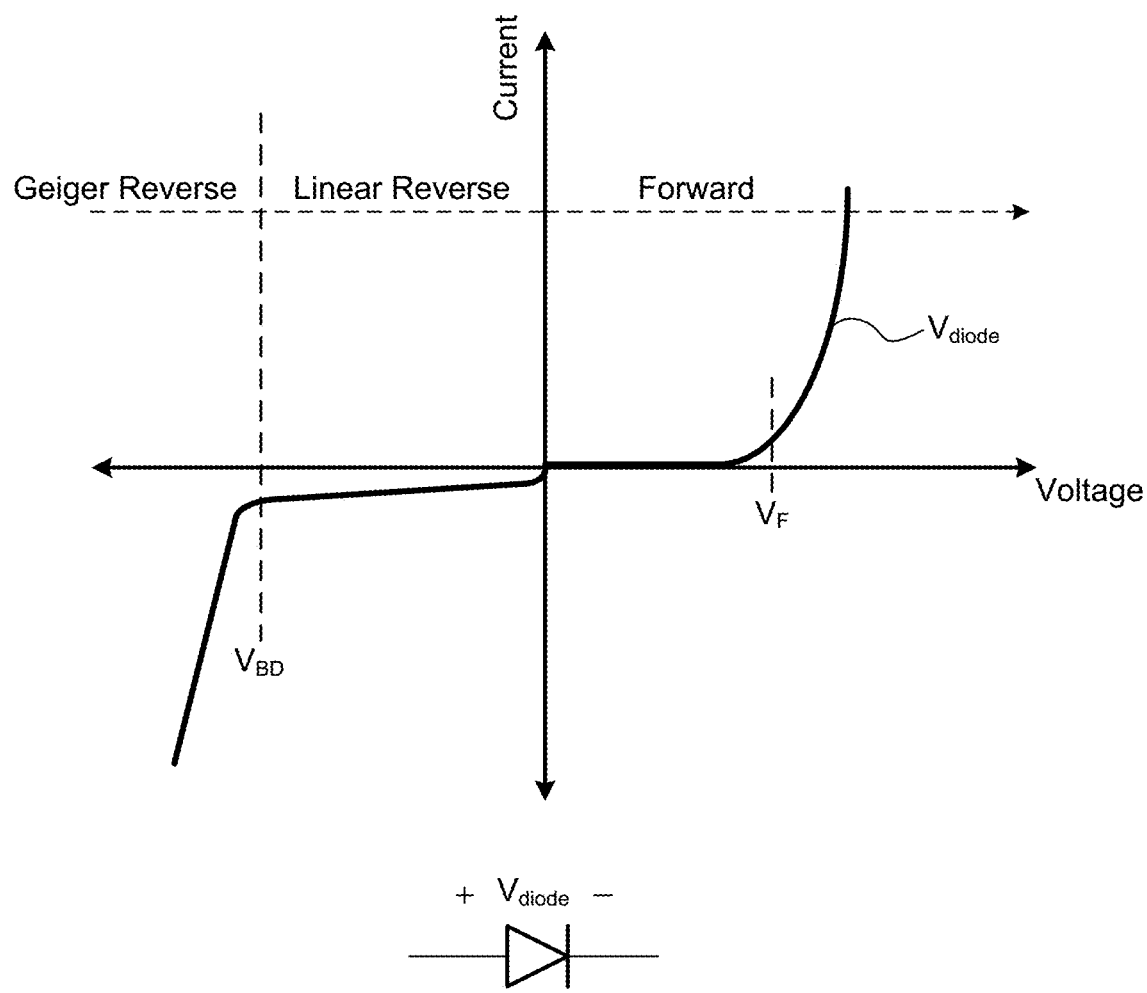
FIG. 4A is a graph illustrating a prophetic current and voltage relationship for a representative diode in accordance with some embodiments.

FIG. 4A is a graph illustrating a prophetic current and voltage relationship for a representative diode in accordance with some embodiments. FIG. 4A illustrates three different bias regions for a diode: a Geiger reverse-biased region, a linear reverse-biased region, and a forward-biased region. As shown in FIG. 4A, in which the voltage across the diode is labelled $V_{diode}$, a positive voltage applied across the diode results in the diode being forward-biased, a negative voltage applied across the diode, with a magnitude less than the magnitude of the breakdown voltage, $V_{BD}$, results in the diode being linear reverse-biased, and a negative voltage across the diode, with a magnitude greater than the magnitude of the breakdown voltage $V_{BD}$ results in the diode being Geiger (avalanche) reverse-biased.

Figure 4B:
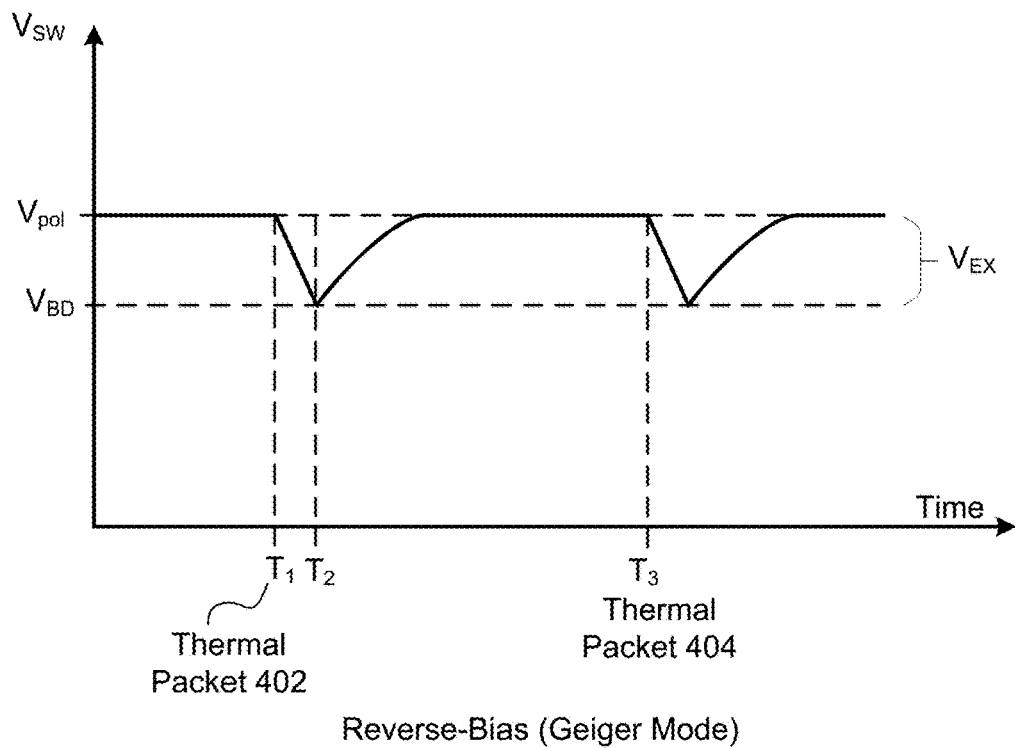
FIG. 4B is a graph illustrating a prophetic example of a representative operating sequence of the circuit of FIG. 3A in accordance with some embodiments.

FIG. 4B is a graph illustrating a prophetic example of a representative operating sequence of the circuit of FIG. 3A in accordance with some embodiments. The graph in FIG. 4B corresponds to the diode 302 of FIG. 3A being reverse-biased beyond a breakdown voltage ($V_{BD}$) of the diode 302 (e.g., in a Geiger mode). FIG. 4B shows a prophetic voltage, $V_{SW}$, across the load component 304 of FIG. 3A (e.g., equivalent to the voltage drop across the diode) varying in response to thermal packets 402 and 404. In the absence of a thermal packet, the voltage across the load component, $V_{SW}$, is equal in magnitude to $V_{pol}$.

At a first time, denoted $T_1$, a thermal packet 402 is received by the diode 302. The thermal packet 402 causes impact ionization within the diode 302, where carriers (e.g., electrons) are accelerated to high kinetic energy and cause additional carriers to flow through the semiconductor lattice, thereby causing an avalanche effect. The avalanche effect continues until the voltage drop across the diode reaches the breakdown voltage. At a second time, $T_2$, the voltage drop across the diode reaches the breakdown voltage, and the electric field of the diode is no longer able to sustain the kinetic energy needed to free additional carriers. Therefore, at time $T_2$ the voltage $V_{SW}$ begins to return to the $V_{pol}$ magnitude. The magnitude of the change in $V_{SW}$ due to the thermal packet 402 is equal to the excess voltage, $V_{EX}$, described above in Equation 1. At a third time, $T_3$, another thermal packet, packet 404, is received by the diode and the process repeats.

Figure 4C:
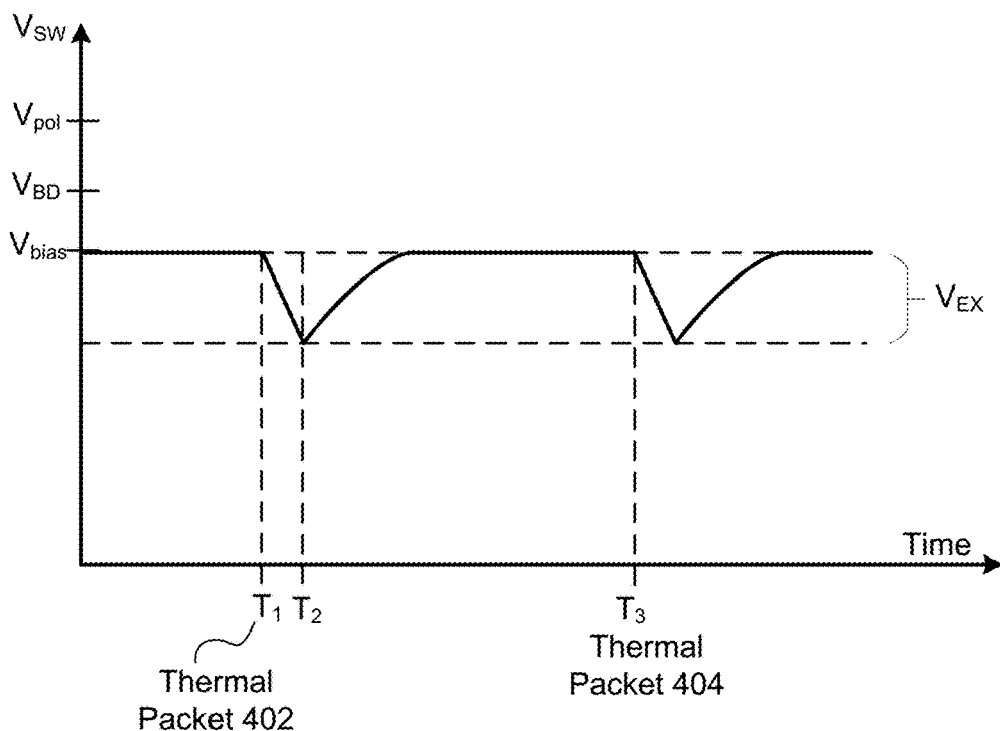
FIG. 4C is a graph illustrating a prophetic example of a representative operating sequence of the circuit of FIG. 3D in accordance with some embodiments.

FIG. 4C is a graph illustrating a prophetic example of a representative operating sequence of the circuit of FIG. 3D in accordance with some embodiments. The graph in FIG. 4C corresponds to the diode 302 of FIG. 3D being reverse-biased beyond a breakdown voltage of the diode 302. FIG. 4C shows a prophetic voltage, $V_{SW}$, across the load component 304 of FIG. 3D (which is offset from the voltage of the diode 302) varying in response to thermal packets 402 and 404. As with the response illustrated in FIG. 4B, the magnitude of the shift in $V_{SW}$ in response to a thermal packet is equal to $V_{EX}$. However, because the load component 304 in FIG. 3D is DC biased by the voltage source 376, e.g., with a bias voltage of $-V_{BiasTee}$, rather than the voltage source 310, in the absence of a thermal packet, the voltage across the load component, $V_{SW}$, is not equal in magnitude to $V_{pol}$. In the example illustrated by FIG. 4C, the voltage across the load component, $V_{SW}$, is smaller in magnitude than $V_{pol}$. In some embodiments, the voltage $V_{SW}$ is biased (e.g., via the voltage source 376) to have a magnitude that is greater than the magnitude of $V_{pol}$, while in other embodiments, the voltage $V_{SW}$ is biased to have a magnitude that is smaller than the magnitude of $V_{pol}$.

Figure 5A:
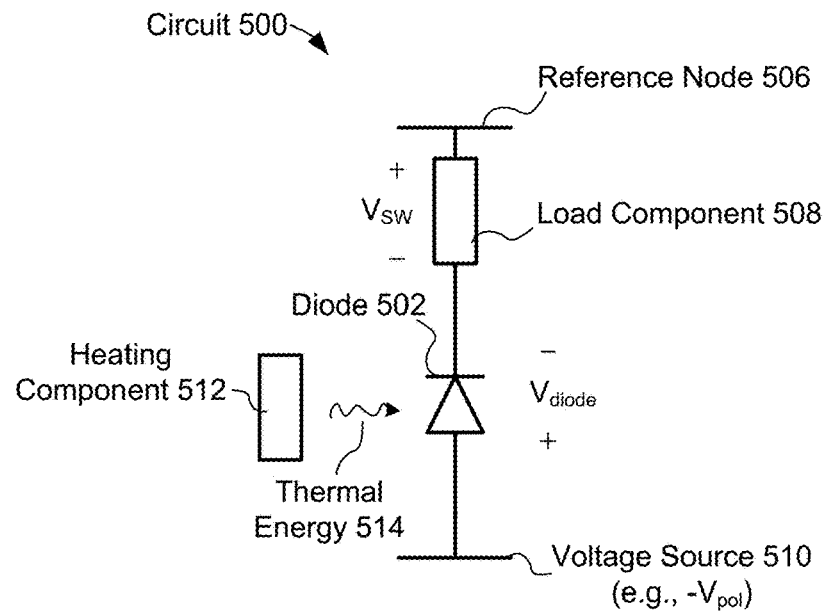
FIGS. 5A-5B are schematic diagrams illustrating representative circuits in accordance with some embodiments.
Figure 5B:
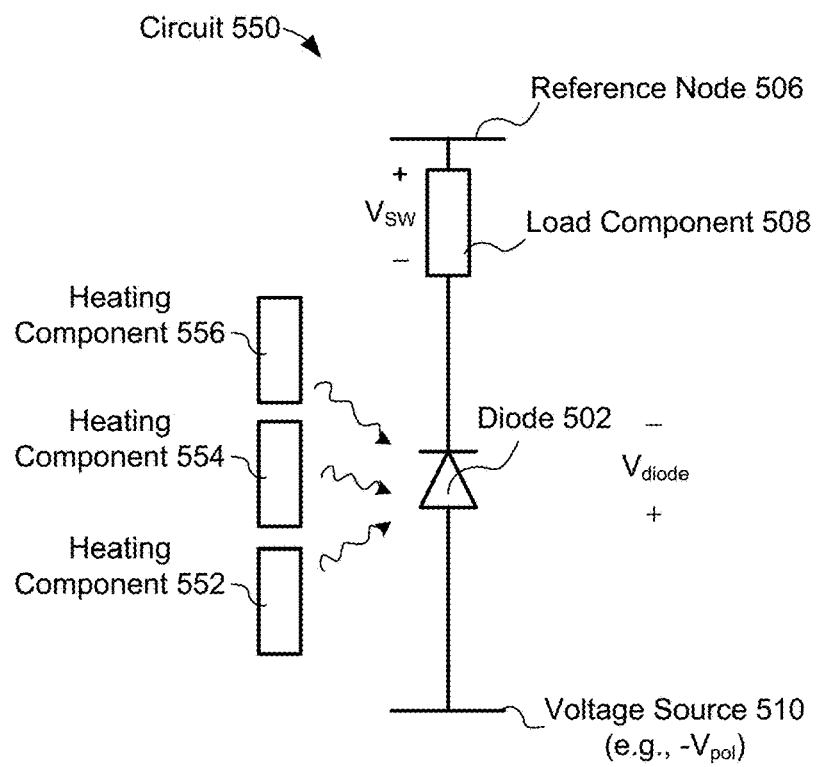

FIGS. 5A-5B are schematic diagrams illustrating representative circuits in accordance with some embodiments. FIG. 5A shows a circuit 500 including a heating component 512 (e.g., heating component 312) thermally coupled to a diode 502 (e.g., diode 302) to provide thermal energy 514. The circuit 500 further includes a load component 508 coupled in series with the diode 502 between a voltage source 510 and a reference node 506 (e.g., an electrical ground). In accordance with some embodiments, the diode 502 is reverse-biased in the linear region. In accordance with some embodiments, a linear reverse-bias mode corresponds to the voltage source 510 complying with Equation 2 below.

$$|V_{pol}| < |V_{BD}|$$

Equation 2—Bias Voltage for Linear Reverse-Bias Mode Diode

In some embodiments, the load component 508 is a resistor. In some embodiments, (not shown) the load component 508 is coupled in parallel with the diode 502. In some embodiments, the load component 508 is a readout circuit arranged and configured to measure a current, voltage, or impedance of the diode 502. In some embodiments, the load component 508 is, or includes, a transimpedance amplifier. In accordance with some embodiments, while the diode 502 is in the linear reverse-bias mode, current flow through the diode is proportional to an amount of thermal energy received at the diode. In this way, the current flow through the diode may be used to determine an amount of heat transfer (which itself may be proportional to a number of photons detected).

FIG. 5B shows a circuit 550 including the diode 502 thermally-coupled to heating components 552, 554, and 556. In some embodiments, the diode 502 is thermally-coupled to the heating components 552, 554, and 556 via a layout arrangement as illustrated in FIG. 1E. In various embodiments, the diode 502 is coupled to differing numbers of heating components, e.g., from 2 to 5, 10, or 20. In some embodiments, the heating components 552, 554, and 556 are sized and positioned so as to transfer substantially similar amounts of heat (e.g., within 20%, 10%, or 5% of one another) to the diode 502. In some embodiments, each heating component is coupled to a respective photon detector (e.g., an SNSPD) so as to transfer heat in response to photon(s) detected by the photon detector. For example, each heating component is, or includes, the circuit 321 of FIG. 3B or the circuit 351 of FIG. 3C.

Figure 6:
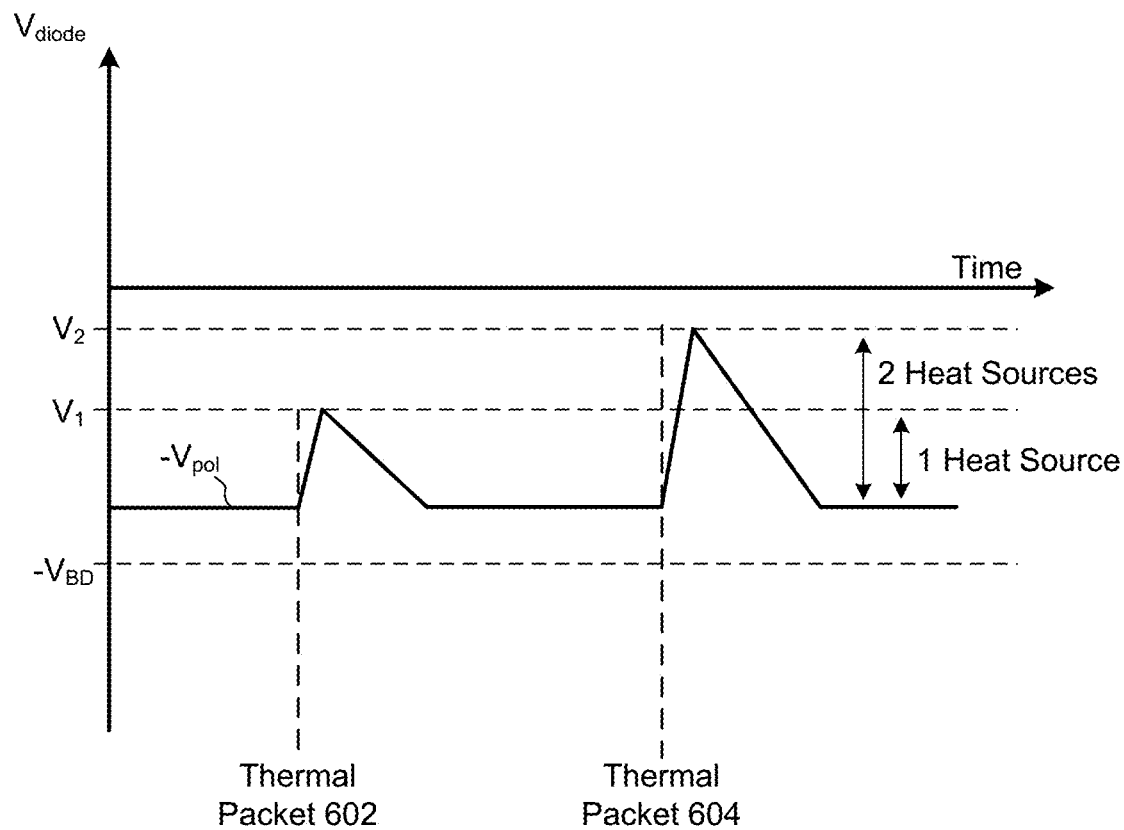
FIG. 6 is a graph illustrating a prophetic example of a representative operating sequence of the circuit of FIG. 5B in accordance with some embodiments.

FIG. 6 is a graph illustrating a prophetic example of a representative operating sequence of the circuit of FIG. 5B in accordance with some embodiments. The graph in FIG. 6 corresponds to the diode 502 of FIG. 5B being in the linear reverse-biased region (e.g., illustrated in FIG. 4A). FIG. 6 shows a prophetic voltage, $V_{diode}$, across the diode 502 varying in response to thermal packets 602 and 604. In the absence of a thermal packet, the voltage $V_{diode}$ is at a first voltage level, denoted $V_0$, between zero volts and the breakdown voltage ($-V_{BD}$). In response to a thermal packet 602 (e.g., from one of heat component 552, 554, and 556), the voltage $V_{diode}$ increases to a second level, $V_1$, before resetting back to $V_0$. In response to a thermal packet 604 (e.g., from two of heat component 552, 554, and 556), the voltage $V_{diode}$ increases to a third level, $V_2$, before resetting back to $V_0$. As shown in FIG. 6, the voltage $V_{diode}$ across the diode 502 varies in proportion to the number of active heat sources (e.g., number of heating components generating heat) in accordance with some embodiments. As described above, in some embodiments, each heating component 522, 524, and 526 includes an SNSPD, and thus the circuit 550 of FIG. 5B operates as a photon number resolving (PNR) circuit in accordance with some embodiments.

Figure 7A:
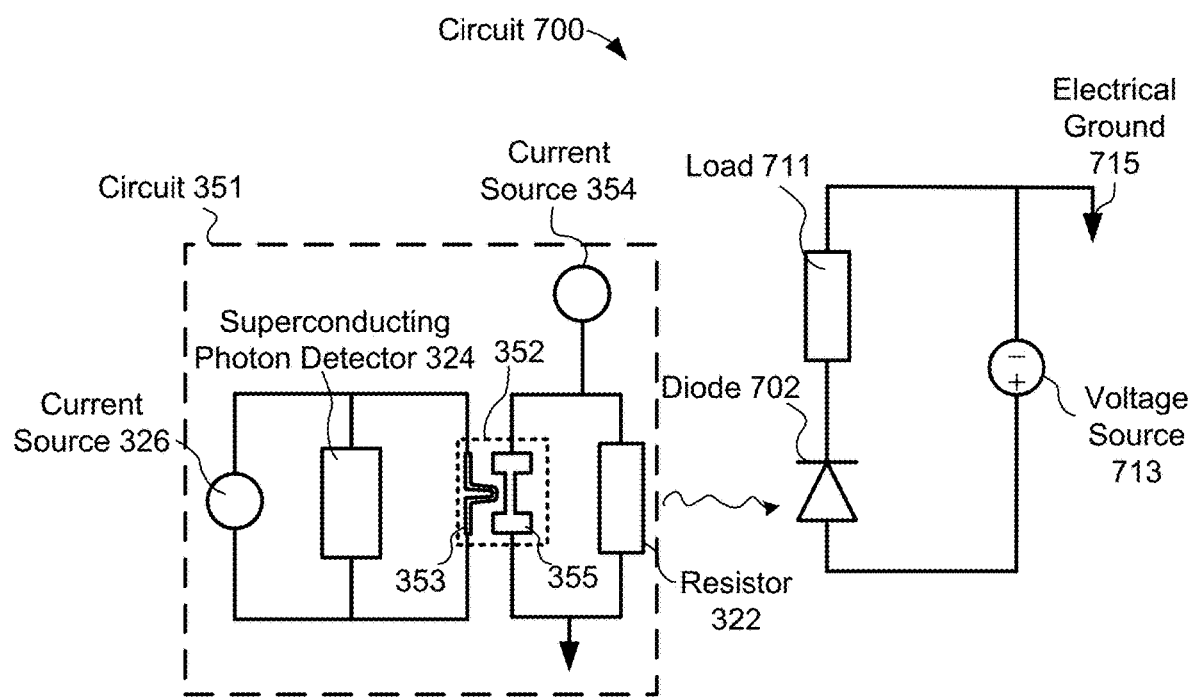
FIG. 7A is a schematic diagram illustrating a representative circuit in accordance with some embodiments.

FIG. 7A is a schematic diagram illustrating a circuit 700 in accordance with some embodiments. The circuit 700 includes a diode 702 thermally coupled to the circuit 351 (described above with respect to FIG. 3C). The diode 702 is electrically coupled to a load 711 and a voltage source 713 and a reference node (e.g., electrical ground 715), such that the voltage source 713 forward-biases the diode 702. In some embodiments, the load 711 is, or includes, a resistor and/or an active load (e.g., a transimpedance amplifier). In some embodiments, the load 711 is, or includes an active load (e.g., a transimpedance amplifier) that may be electrically coupled, either in series or in parallel, with one or more passive devices (e.g., resistor, inductor, capacitor, etc.). In some embodiments, the load 711 is, or includes, an inductor, a capacitor, or the like.

In accordance with some embodiments, the diode 702 is maintained at a temperature below a threshold operating temperature of the diode. That is, the diode 702 is maintained in an "off" (freeze-out) state in the absence of heat from the circuit 351. In accordance with some embodiments, the circuit 351 is configured to selectively generate heat sufficient to bring the temperature of the diode 702 above the threshold operating temperature, thereby transitioning the diode 702 to an "on" state. For example, in response to an incident photon detected by the superconducting photon detector 324, resistive heat is generated by the resistor 322. In this example, the resistive heat transfers to the diode 702 and warms the diode above a threshold operating temperature, transitioning the diode from an "off" state to an "on" state, that is detected by the load 711.

In some embodiments, the voltage source 713 provides a direct current (DC) voltage and an alternating current (AC) voltage. In some embodiments, the voltage source 713 is configured to provide an AC voltage on top of the DC voltage such that the diode 702 transitions in and out of conduction in a cyclical manner corresponding to a frequency or a period of the AC voltage. In some embodiments, the circuit 700 includes one or more additional components (not shown) for resetting the diode to the freeze-out state.

Figure 7B:
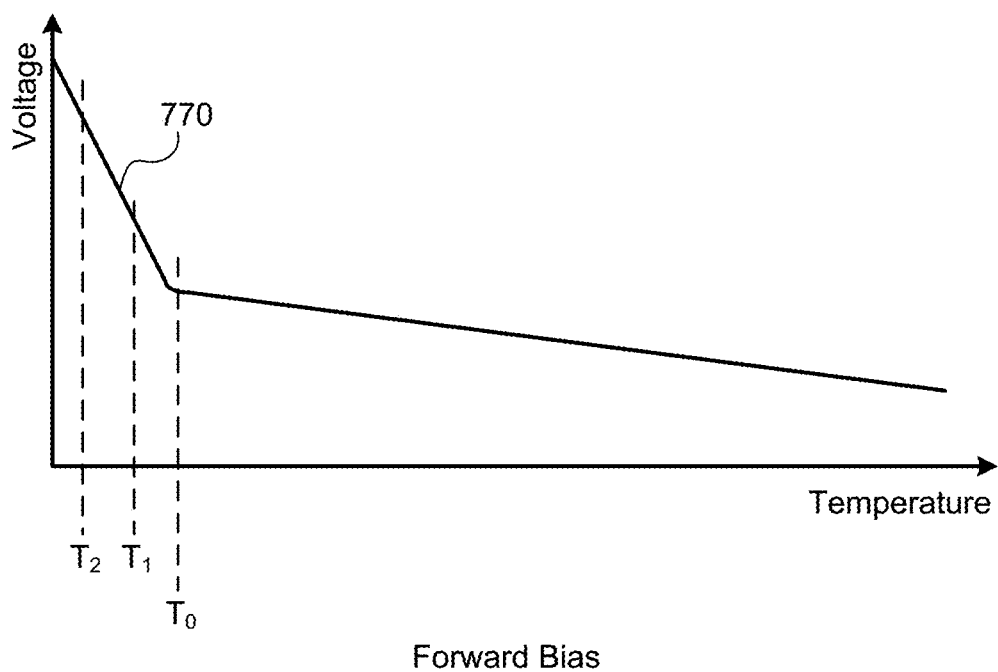
FIG. 7B is a graph illustrating a prophetic example of a relationship between voltage and temperature in a representative diode in accordance with some embodiments.

FIG. 7B is a graph illustrating a prophetic example of a relationship between voltage and temperature in a representative diode in accordance with some embodiments. As shown in FIG. 7B, at temperatures below a threshold temperature, $T_0$, the voltage across the diode, voltage 770, changes more dramatically with changes in temperature, as compared to voltage 770 above the threshold temperature, $T_0$.

Figure 7C:
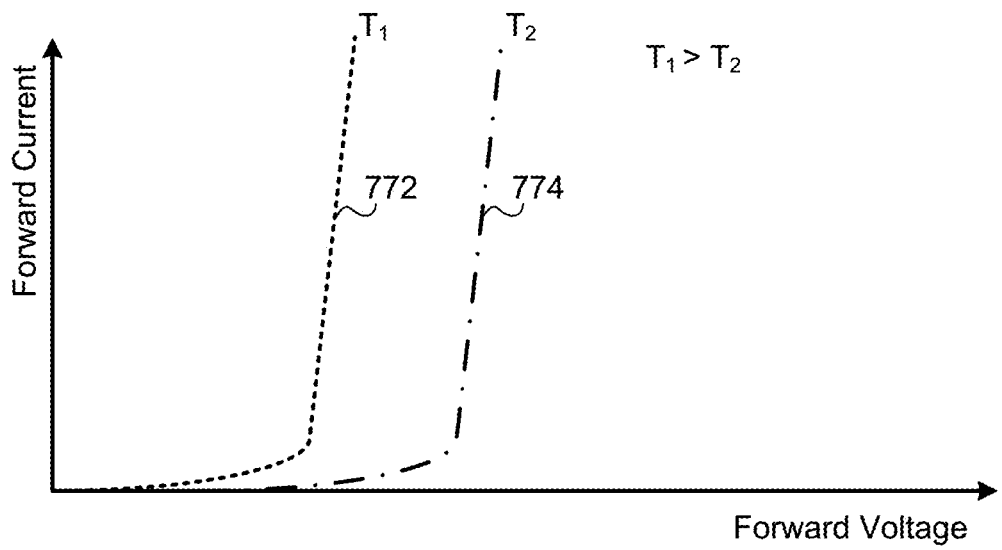
FIG. 7C is a graph illustrating a prophetic example of a relationship between current and voltage in a representative diode in accordance with some embodiments.

FIG. 7C is a graph illustrating a prophetic example of a relationship between current and voltage in a representative diode in accordance with some embodiments. FIG. 7C shows a respective current-voltage curve for two temperatures, $T_2$ and $T_1$. The curve 772 corresponds to $T_1$, and the curve 774 corresponds to $T_2$, which is a lower temperature than $T_1$, as shown in FIG. 7B. In some embodiments, the voltage at temperature $T_1$ is between 100 millivolts (mV) and 1000 mV less than the voltage at temperature $T_2$ for a given current.

Figure 8:
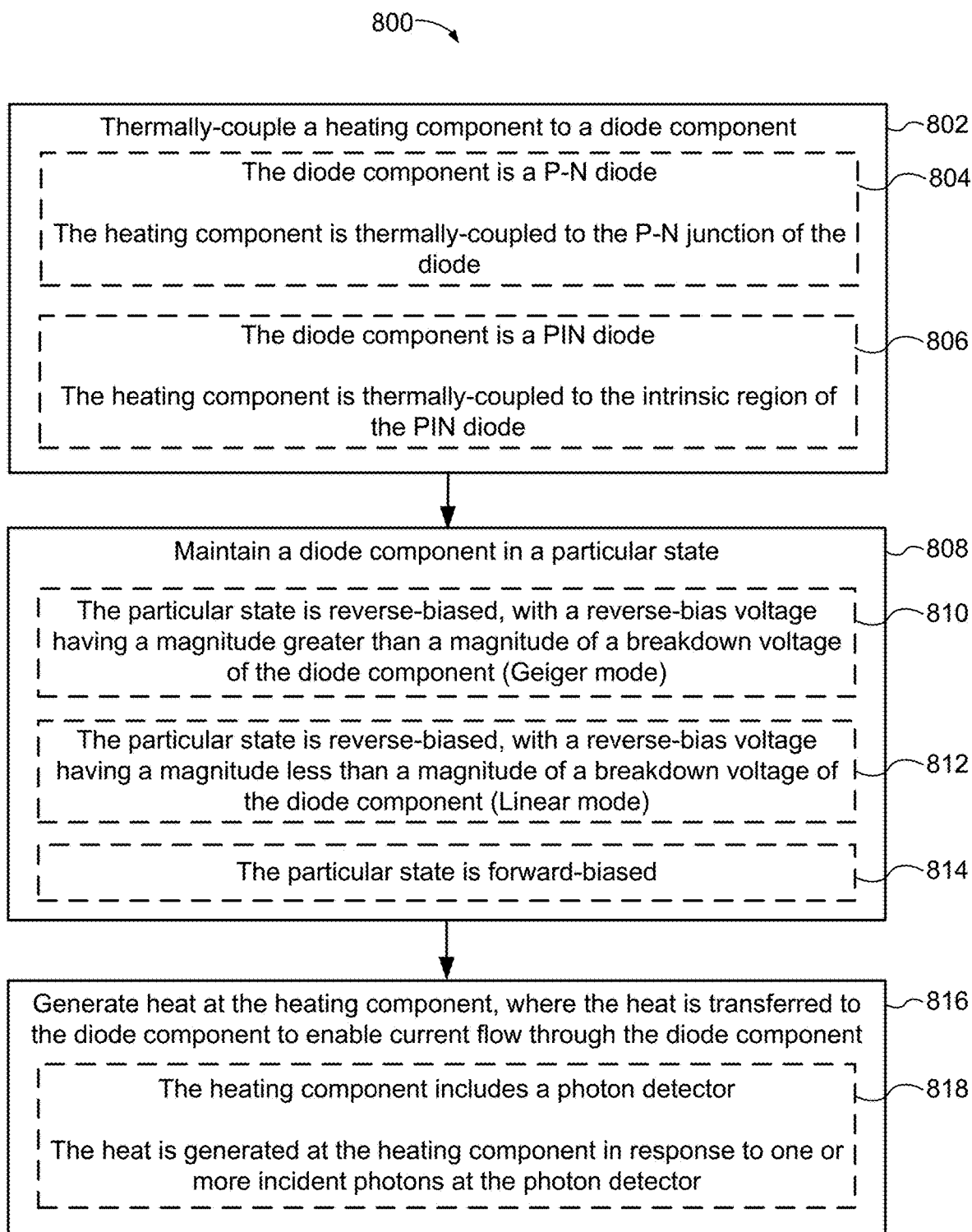
FIG. 8 is a flow diagram illustrating a representative method of operating a diode device in accordance with some embodiments.

FIG. 8 is a flow diagram illustrating a method 800 of operating a diode device in accordance with some embodiments. In some embodiments, the method 800 is performed by a circuit that includes a thermal diode (e.g., thermal diode 150, FIG. 1C). For example, the method 800 is optionally performed by one of the circuits 300, 320, 350, 370, 500, 550, and 700.

A circuit thermally-couples (802) a heating component to a diode component. For example, in the circuit 300 in FIG. 3A, the diode 302 is thermally-coupled to a heating component 312. In some embodiments, the circuit includes: (1) the diode component (e.g., one of the diodes 100 and 110, FIGS. 1A-1B) having a particular energy band gap; (2) an electrical source (e.g., the voltage source 310, FIG. 3A) electrically coupled to the diode component and configured to bias the diode component in a particular state; and (3) the heating component (e.g., one of the heating components 154, 164, 182, 184, and 186, FIGS. 1C-1E) thermally coupled to a junction of the diode component and configured to selectively supply heat corresponding to the particular energy band gap. In some embodiments, the circuit further includes a load resistor (e.g., the resistor 308) coupled in series with the electrical source and the diode component.

In some embodiments, the heating component is adjacent to the junction of the diode component (e.g., as illustrated in FIGS. 1C-1E and 2A-2D). In some embodiments, the heating component is separated from the junction of the diode component by a thermally-conductive, electrically-insulating component (e.g., the separator 152, FIG. 1C).

In some embodiments, the diode component is a P—N diode (804), and the heating component is thermally-coupled to the P-N junction of the diode. For example, FIG. 1C shows a P—N diode (diode 100) thermally-coupled to a heating component 154 via separator 152.

In some embodiments, the diode component is a PIN diode (806), and the heating component is thermally-coupled to at least a portion of the intrinsic region of the diode. For example, FIG. 1D shows a PIN diode (diode 110) thermally-coupled to a heating component 164 via separator 162. In some embodiments, the diode component is a single-photon avalanche diode. In some embodiments, the diode component is an avalanche photodiode.

The circuit maintains (808) the diode component in a particular state. In some embodiments, the circuit maintains the diode in the particular state by supplying a particular voltage to the diode. For example, the voltage source 510 in FIG. 5A supplies a voltage to the diode 502 such that the voltage drop across the diode 502 is $V_{pol}$. In some embodiments, the particular state is (810) reverse-biased, with a magnitude of the reverse bias voltage across the diode that is greater than a magnitude of a breakdown voltage of the diode component (e.g., the Geiger reverse region in FIG. 4A). For example, in accordance with some embodiments, the voltage supplied to the diode 302 in FIG. 3A has a magnitude that is greater than a magnitude of a breakdown voltage of the diode (e.g., complies with Equation 1 above). In some embodiments, the electrical source (e.g., the voltage source 310, FIG. 3A) is configured to supply a reverse-bias voltage with a magnitude below a magnitude of a breakdown voltage of the diode component (e.g., a voltage that complies with Equation 1).

In some embodiments, the particular state is (812) reverse-biased, with a magnitude of the reverse bias voltage across the diode that is less than the magnitude of the breakdown voltage of the diode component (e.g., the linear reverse region in FIG. 4A). For example, in accordance with some embodiments, the voltage supplied to the diode 502 in FIG. 5A has a magnitude that is less than the magnitude of the breakdown voltage of the diode (e.g., complies with Equation 2 above). In some embodiments, the electrical source (e.g., the voltage source 510, FIG. 5A) is configured to supply a reverse-bias voltage with a magnitude that is less than a magnitude of a breakdown voltage of the diode component (e.g., a voltage that complies with Equation 2).

In some embodiments, the particular state is (814) forward-biased (e.g., the forward region in FIG. 4A). For example, in accordance with some embodiments, the voltage supplied to the diode 702 in FIG. 7A is a positive voltage, thereby forward-biasing the diode.

In some embodiments, the particular state is a freeze-out state. In some embodiments, such as when the diode is forward-biased, the circuit maintains the diode component in a freeze-out state by maintaining it at a temperature below a threshold operating temperature of the diode component. In some embodiments, the diode component is maintained at temperatures below the threshold operating temperature via a cryostat or the like. In some embodiments: (1) the diode component is maintained at a temperature below a freeze-out temperature for the diode component; and (2) the heating component is configured to selectively supply heat to the diode component sufficient to raise the temperature of the diode component above the freeze-out temperature.

The circuit generates (816) heat at the heating component, where the heat is transferred to the diode component to enable current flow through the diode component. For example, resistive heat is generated by the heating component in response to current from a current source. In accordance with some embodiments, the heating component 312 in FIG. 3A generates thermal energy 314 that is transferred to the diode 302.

In some embodiments, the heating component includes (818) a photon detector, and the heat is generated at the heating component in response to one or more incident photons at the photon detector. For example, the resistor 322 in FIG. 3B generates resistive heat in response to additional current flowing from the current source 326, where the additional current is redirected to the resistor 322 from the superconducting photon detector 324 in response to incident photons at the superconducting photon detector. In some embodiments, heating component includes a photon detector component, and is configured to generate the heat in response to one or more incident photons at the photon detector component. In some embodiments: (1) the heating component is, or includes, a superconducting component configured to transition from a superconducting state to a non-superconducting state in response to an electrical current; and (2) the heat is resistive heat generated by the superconducting component in the non-superconducting state. In some embodiments, the heating component is, or includes, a resistive component (e.g., the resistor 322, FIG. 3B) that generates the heat while an electrical current flows through the resistive component.

In some embodiments, an output component (e.g., one of the load components 304, 508, and 711) is electrically coupled to the diode component. In some embodiments, the output component is, or includes, an optical switch (e.g., the optical switch 916 in FIG. 9B). In some embodiments, the output component is, or includes, an optical switch AC-coupled to the diode component (e.g., as illustrated in FIG. 3D).

Figure 9A:
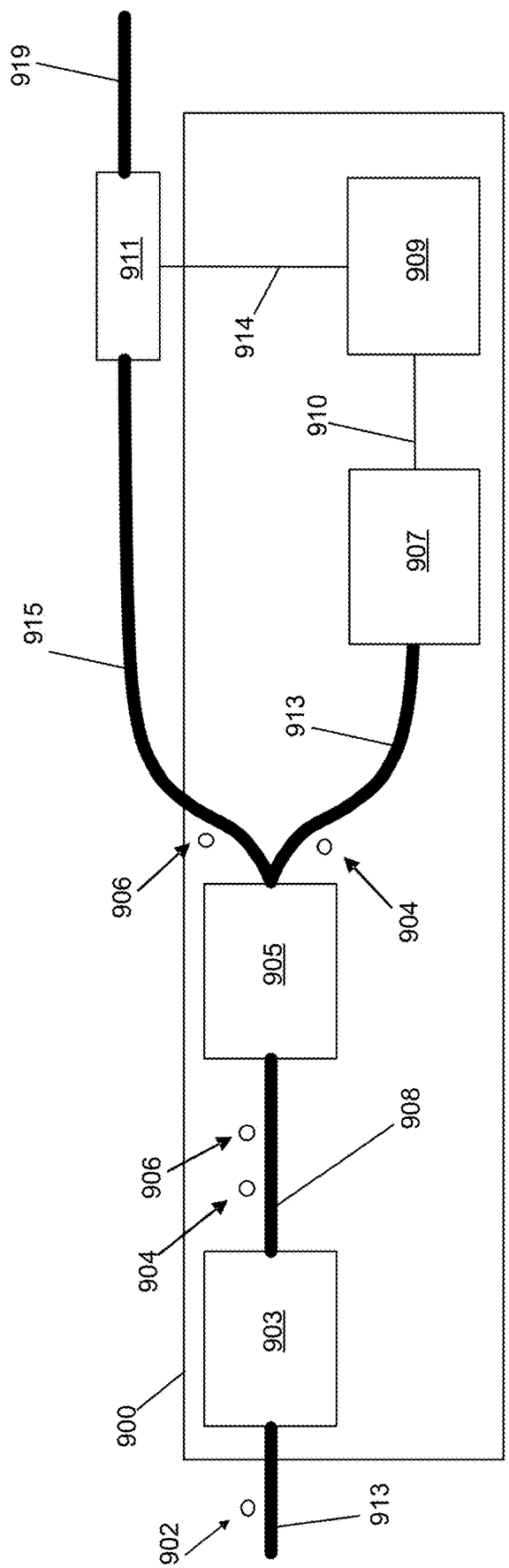
FIGS. 9A-9B illustrate a representative photonic circuit employing a diode device in accordance with some embodiments.
Figure 9B:
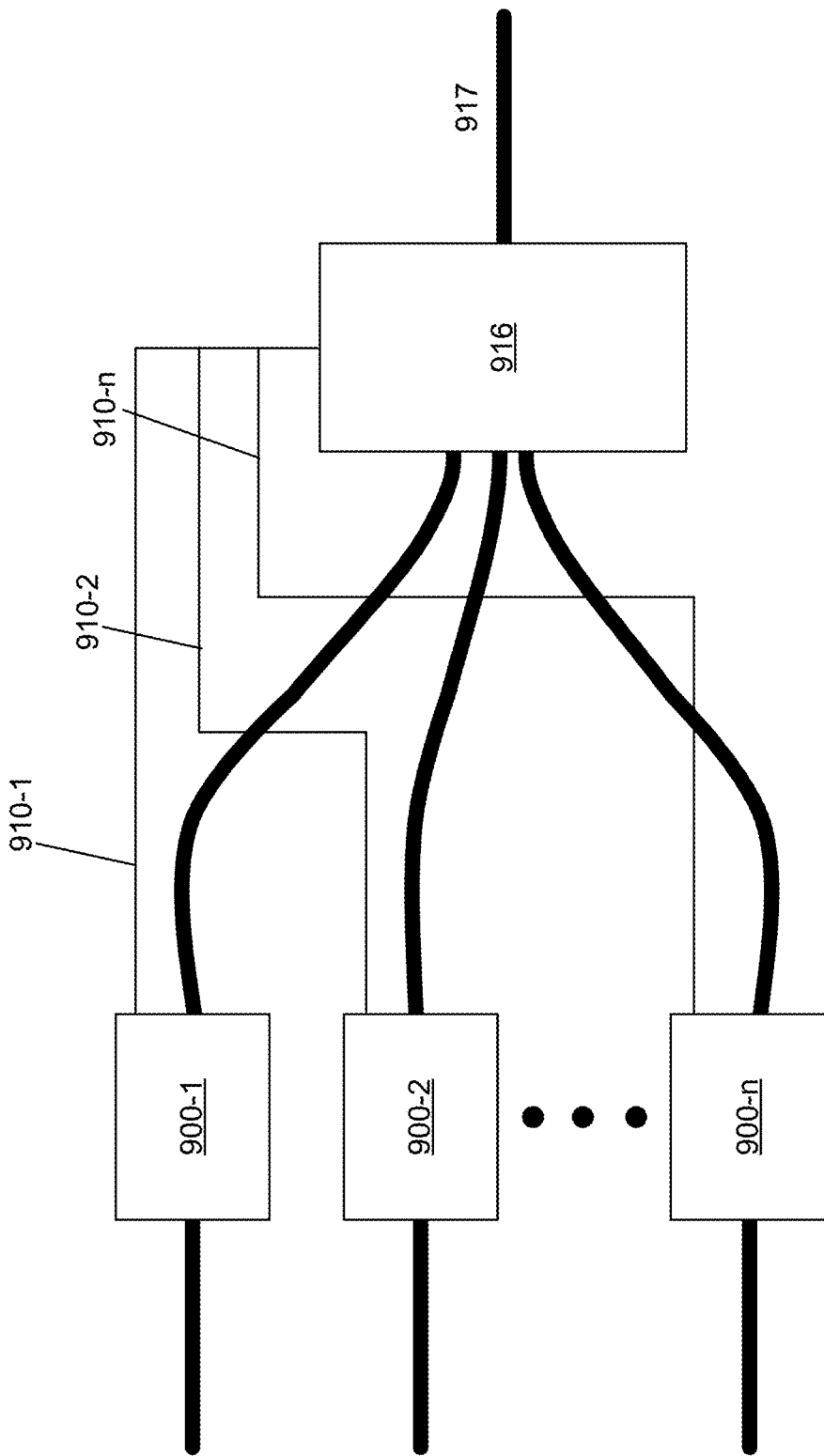

FIGS. 9A-9B show examples of a photonic system that can employ one or more thermal diodes (e.g., diode switches) in accordance with one or more embodiments. In the embodiments shown in FIGS. 9A-9B, a thermal diode, e.g., any of the thermal diodes 150, 160, 180, 200, 210, 220, 240, and/or any of the circuits or arrangements shown in FIGS. 1A-7A described above can be employed as one or more switches. More specifically, the FIGS. 9A-9B illustrate a heralded single photon source in accordance with some embodiments. Such a source can be used within any system for which a source of single photons is useful, e.g., within a quantum communications system and/or a quantum computer that employs entangled photons as the physical qubits.

Turning to FIG. 9A, a heralded single photon source 900 is illustrated in accordance with one or more embodiments. Thick black lines in the figure represent optical waveguides and thin black lines represent electrical interconnects (e.g. wires that may be formed from superconducting or non-superconducting materials). The system is a hybrid photonic/electrical circuit that includes a pumped photon pair generator 903, a wavelength division multiplexer (WDM) 905 (which is a 1×2 WDM in this example), a superconducting photon detector 907, an amplifier circuit 909, and an optical switch 911. One or more components of the system can be housed in a cryogenic environment, such as a cryostat, held at a temperature that is lower than the threshold temperature for superconductivity, as described above.

An input optical waveguide 913 optically couples a pump photon source (not shown) to photon pair generator 903. A pump photon 902 enters the pumped photon pair generator 903 via input optical waveguide 913. For the sake of illustration, any photons illustrated here are depicted outside of the waveguides, but one of ordinary skill will appreciate that in a physical device, these photons will propagate within one or more guided modes of the waveguide. In some embodiments, the pumped photon pair generator 903 can include a nonlinear optical material that generates two output photons, referred to as signal photon 904 and idler photon 906 from one or more input pump photons 902. For example, the pumped photon pair generator 903 can generate a pair of output photons using a process known as spontaneous four wave mixing. The pair of output photons, signal photon 904 and idler photon 906, are typically generated having different wavelengths/frequencies, e.g., with the sum of the energies of the signal and idler equal to the energy of the pump photon. After generation, signal photon 904 and idler photon 906 are optically coupled to the input of WDM 905 via waveguide 908. Because photons 904 and 906 have different wavelengths/frequencies, WDM 905 redirects each photon along a different output waveguide, e.g., signal photon 904 is directed along the heralding waveguide path 913 and idler photon 906 is redirected along the switched output waveguide path 915. Which photon is directed to which path is not critical and the path of the idler photon and signal photon can be exchanged without departing from the scope of the present disclosure.

In this example, a superconducting photon detector 907, e.g., a superconducting nanowire single photon detector, is optically coupled to the heralding waveguide path 913 and can produce an electrical signal (e.g. a current pulse, also referred to as a photon heralding signal) in response to the detection of the signal photon 904. Because the signal photon 904 and idler photon 906 were generated nearly simultaneously as a pair, the electrical signal generated by the photon detector 907 signals (i.e., "heralds") the presence of the idler photon 906 in the switched output waveguide path 915. The heralding signal is often a small amplitude current signal, e.g., microamps or less, and can be provided to the amplifier circuit 909 where it is amplified to a larger output signal that can be used to more effectively drive any downstream electronic and/or photonic circuits.

Referring momentarily to the FIGS. 3B-3C described above, the superconducting photon detector 907 corresponds to the superconducting photon detector 324 that provides a small current to the resistor 322 or the heat transfer component 352 in response to an incident photon. The small current generates heat for the diode 302, which generates a relatively larger current. The larger current is then provided to the optical switch 911 (e.g., the load component 304 in FIGS. 3B-3C) via output electrical signal line 914. Accordingly, the use of the amplifier circuit 909 provides for a system that can drive higher current loads than would be the case with photon detector 907 operating on its own. After being switched, the idler photon 906 is provided via output waveguide 919, e.g., for use in constructing a highly entangled resource state for use in a downstream optical quantum computing system (not shown).

FIG. 9B illustrates how several single photon sources similar to photon source 900 can be multiplexed to increase the reliability of the photon generation process. Such a system is beneficial because of the non-deterministic nature of the conversion between the pump photon and the photon pair in the photon pair generator 903. More specifically, because the photon pair generation process is a quantum mechanical process, it is inherently probabilistic, and thus it is not guaranteed that every pump photon that enters a photon pair generator 903 will result in the generation of a photon pair at the output. In fact, in some instances, the photon pair creation can fail entirely. Thus, to improve the reliability of the photon generation process, several single photon generators 900-1, 900-2, . . . , 900-n, each receiving its own pump photon per generation cycle, can be arranged in parallel and optically (and electrically) coupled to a Nx1 switch 916, as shown. As with the heralded single photon source 900, each single photon generator 900-1, 900-2, . . . , 900-n possesses, or has an output coupled to, a corresponding dedicated heralding electrical signal line 910-1, 910-2, . . . , 910-n, which can provide a heralding signal that informs a downstream circuit element of the successful generation of a photon by that particular photon source. In some embodiments, the heralding electrical signal lines 910-1, 910-2, . . . , 910-n are electrically coupled to the Nx1 optical switch 916. The Nx1 optical switch 916 includes digital logic that interprets the heralding electrical signals and switches the input port of the switch 916 accordingly so as to provide the generated idler photon to the output port 917. Thus, in this case, each photon source 900 includes an amplifier circuit whose internal arrangement of current sources, heat source(s), and diode(s) provides for enough amplification to drive the logic stage of the Nx1 switch. In other examples, a small signal logic circuit can be employed before the amplifier and Nx1 switch. One of ordinary skill will appreciate that other arrangements are possible without departing from the scope of the present disclosure.

It will also be understood that, although the terms first, second, etc. are, in some instances, used herein to describe various elements, these elements should not be limited by these terms. These terms are only used to distinguish one element from another. For example, a first current could be termed a second current, and, similarly, a second current could be termed a first current, without departing from the scope of the various described embodiments. The first current and the second current are both currents, but they are not the same condition unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to

What is claimed is:

1. A photon number resolving detector comprising:
a diode having a particular energy band gap;
a plurality of heating components thermally coupled to a junction of the diode, the plurality of heating components comprising a first heating component and a second heating component, each heating component comprising a respective photon detector configured to generate heat that corresponds to the particular energy band gap in response to one or more respective incident photons; and
a readout circuit to generate a first voltage in response the first heating component receiving an incident photon, and to generate a second voltage in response to the first heating component receiving the incident photon and the second heating component receiving an additional incident photon, the second voltage being higher than the first voltage.

2. The photon number resolving detector of claim 1, wherein the plurality of heating components further comprises a third heating component.

3. The photon number resolving detector of claim 2, wherein the readout circuit is further configured to generate a third voltage in response to the first heating component, the second heating component, and the third heating component each receiving a respective photon, the third voltage being higher than the second voltage.

4. The photon number resolving detector of claim 1, wherein the diode is reverse biased by an electrical source.

5. The photon number resolving detector of claim 1, wherein each respective photon detector comprises a superconducting photon detector.

6. The photon number resolving detector of claim 5, wherein the superconducting photon detector transitions from a superconducting state to a non-superconducting state in response to a photon incident to the superconducting photon detector, wherein resistive heat is generated by the superconducting photon detector in the non-superconducting state.

7. The photon number resolving detector of claim 5, wherein the superconducting photon detector comprises one or more nanowires configured to detect single photons.

8. The photon number resolving detector of claim 1, wherein the photon number resolving detector is arranged within a cryogenic enclosure to maintain each respective photon detector at a cryogenic temperature.

9. The photon number resolving detector of claim 8, wherein the cryogenic temperature is below 100 K.

10. The photon number resolving detector of claim 1, wherein each heating component is separated from the junction of the diode by a thermally-conductive, electrically-insulating component.

11. The photon number resolving detector of claim 1, wherein each heating component is configured to generate heat energy in a range of 100 nanowatts to 10 milliwatts.

12. A method comprising:
maintaining a photon number resolving detector at a cryogenic temperature, the photon number resolving detector comprising a diode and a plurality of heating components that are thermally coupled to the diode, the diode having a particular energy band gap, the plurality of heating components comprising a first heating component and a second heating component, each heating component comprising a respective photon detector configured to generate heat that corresponds to the particular energy band gap;
generating heat from the first heating component in response to the first heating component receiving an incident photon, the heat being coupled to the diode to increase voltage at a readout circuit; and
generating a voltage on the readout circuit in response to the incident photon.

13. The method of claim 12, wherein the voltage is a first voltage, the incident photon is a first incident photon, and the method further comprises:
generating additional heat from the first heating component in response to the first heating component receiving a first additional incident photon and further in response to the second heating component receiving a second additional incident photon, the additional heat being coupled to the diode to increase voltage at the readout circuit; and
generating a second voltage on the readout circuit in response to the first additional incident photon and the second additional incident photon, the second voltage being higher than the first voltage.

14. The method of claim 12, wherein the diode is reverse biased by an electrical source.

15. The method of claim 12, wherein each respective photon detector comprises a superconducting photon detector.

16. The method of claim 15, wherein the superconducting photon detector transitions from a superconducting state to a non-superconducting state in response to a photon incident to the superconducting photon detector, wherein resistive heat is generated by the superconducting photon detector in the non-superconducting state.

17. The method of claim 15, wherein the superconducting photon detector comprises one or more nanowires to detector single photons.

18. The method of claim 12, wherein the photon number resolving detector is arranged within a cryogenic enclosure to maintain each respective photon detector at a cryogenic temperature.

19. The method of claim 18, wherein the cryogenic temperature is below 100 K.

20. The method of claim 12, wherein each heating component is configured to generate heat energy in a range of 100 nanowatts to 10 milliwatts.

* * * * *